United States Patent
Kaneda et al.

(10) Patent No.: US 8,178,001 B2
(45) Date of Patent: May 15, 2012

(54) METHOD FOR PRODUCING INORGANIC COMPOUND, PHOSPHOR, PHOSPHOR-CONTAINING COMPOSITION, LIGHT-EMITTING DEVICE, LIGHTING SYSTEM, AND DISPLAY DEVICE

(75) Inventors: Hideaki Kaneda, Ushiku (JP); Hiromu Watanabe, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 748 days.

(21) Appl. No.: 12/282,656

(22) PCT Filed: Apr. 14, 2008

(86) PCT No.: PCT/JP2008/057262
§ 371 (c)(1),
(2), (4) Date: Sep. 12, 2008

(87) PCT Pub. No.: WO2008/133077
PCT Pub. Date: Nov. 6, 2008

(65) Prior Publication Data
US 2010/0231121 A1    Sep. 16, 2010

(30) Foreign Application Priority Data
Apr. 18, 2007  (JP) .................. 2007-108924

(51) Int. Cl.
C09K 11/77 (2006.01)
C09K 11/08 (2006.01)
H01L 33/00 (2010.01)

(52) U.S. Cl. ............... 252/301.4 F; 313/503; 313/486; 257/98

(58) Field of Classification Search ........... 252/301.4 F; 313/503, 486
See application file for complete search history.

(56) References Cited

U.S. PATENT DOCUMENTS
2006/0006782 A1 *  1/2006  Nagatomi et al. ............ 313/486
2008/0128726 A1 *  6/2008  Sakata et al. .................. 257/98

FOREIGN PATENT DOCUMENTS
JP      2006 8721       1/2006
JP      2006 8948       1/2006
WO  WO 2006/080535   *   8/2006

* cited by examiner

Primary Examiner — Carol M Koslow
(74) Attorney, Agent, or Firm — Oblon, Spivak, McClelland, Maier & Neustadt, L.L.P.

(57) ABSTRACT

A method for producing a CASN phosphor which has an emission peak wavelength in a long wavelength range and which is prevented from being reduced in emission peak intensity, a phosphor suitable for use in displays having a NTSC ratio higher than that of conventional one, a composition containing the phosphor, a light-emitting device containing the phosphor, a display, and a lighting system. A method for producing an inorganic compound represented by the following formula from a feedstock in which the amount of Si is greater than one mole and less than 1.14 moles per mole of Al:

$$M1_a M2_b AlSiX_3 \qquad (I)$$

where M1 represents an activation element containing at least Eu, M2 represents one or more selected from alkaline-earth metal elements, X represents one or more selected from the group consisting of O and N, and a and b each represent a positive number satisfying the inequalities $0 < a \leq 0.1$ and $0.8 \leq a+b \leq 1$.

14 Claims, 5 Drawing Sheets

METHOD FOR PRODUCING INORGANIC COMPOUND, PHOSPHOR, PHOSPHOR-CONTAINING COMPOSITION, LIGHT-EMITTING DEVICE, LIGHTING SYSTEM, AND DISPLAY DEVICE

CROSS REFERENCE TO RELATED APPLICATION

This application is a 371 of PCT/JP08/057262, filed on Apr. 14, 2008, and claims priority to Japanese Patent Application No. 2007-108924, filed on Apr. 18, 2007.

FIELD OF THE INVENTION

The present invention relates to a method for producing an inorganic compound which is a crystal structure represented by the formula $CaAlSiN_3$ and which is known as red phosphors, phosphor produced by the methods, phosphor-containing composition containing the phosphor, a light-emitting device containing the phosphor, a lighting system including the light-emitting device, and a display device including the light-emitting device. The present invention particularly relates to a method for producing an inorganic compound which can be prevented from being reduced in emission peak intensity and which has a long emission peak wavelength, a phosphor produced by the method, a phosphor-containing composition containing the phosphor, a light-emitting device containing the phosphor, a lighting system including the light-emitting device, and a display including the light-emitting device.

BACKGROUND OF THE INVENTION

Phosphors (hereinafter referred to as "CASN phosphors") with a crystal structure represented by the formula $CaAlSiN_3$ are known as red phosphors which emit light with a wavelength greater than that of the light emitted from rare-earth element-activated sialon phosphors and which have high brightness (see Patent Documents 1 and 2).

Patent Document 1 discloses that an increase in the content of Eu, which is an activation element, reduces emission intensity because of concentration quenching.

Patent Document 2 discloses that the phosphors have been produced using different types of Eu-containing compounds.

Patent Document 1: Japanese Unexamined Patent Application Publication No. 2006-8721

Patent Document 2: Japanese Unexamined Patent Application Publication No. 2006-8948

Since there is an increasing demand for displays having a high NTSC ratio in recent years, CASN phosphors having a longer emission peak wavelength are increasingly demanded as compared to conventional ones. Therefore, the following method has been demanded: a method for producing a CASN phosphor which can be prevented from being reduced in emission peak intensity and which has a long emission peak wavelength.

SUMMARY OF THE INVENTION

The inventors have made intensive investigations to solve the problem and have then found that a phosphor prevented from being reduced in emission intensity can be obtained in such a manner that the amount of Si per mole of a source material is set to be greater than the theoretical amount by a specific amount in the course of producing a CASN phosphor having emission peaks at longer wavelengths. This has resulted in the completion of the present invention. Furthermore, the inventors have found that a phosphor prevented from being reduced in emission intensity can be obtained using a halide as a source of Eu. This has also resulted in the completion of the present invention.

The present invention provides:

a method for producing an inorganic compound represented by the following formula:

$$M1_aM2_bAlSiX_3 \tag{I}$$

where M1 represents an activation element containing at least Eu, M2 represents one or more selected from alkaline-earth metal elements, X represents one or more selected from the group consisting of O and N, and a and b each represent a positive number satisfying the inequalities $0<a\leqq0.1$ and $0.8\leqq a+b\leqq1$, the method including firing a feedstock prepared by mixing compounds serving as sources of Al, Si, the element represented by M1, and the element represented by M2, wherein the amount of Si in the feedstock is greater than one mole and less than 1.14 moles per mole of Al;

a phosphor containing an inorganic compound produced by the method;

a phosphor containing an inorganic compound represented by the following formula:

$$M1_aM2_bAlSiX_3 \tag{I}$$

where M1 represents an activation element containing at least Eu, M2 represents one or more selected from alkaline-earth metal elements, X represents one or more selected from the group consisting of O and N, and a and b each represent a positive number satisfying the inequalities $0<a\leqq0.1$ and $0.8\leqq a+b\leqq1$, the phosphor having an emission peak wavelength of 650 nm or more and an internal quantum efficiency of 0.75 or more when being excited with 455-nm wavelength light;

a phosphor-containing composition containing these phosphors;

a light-emitting device containing these phosphors;

a lighting system including the light-emitting device; and a display including the light-emitting device.

The present invention provides a method for producing a CASN phosphor which has an emission peak wavelength in a long wavelength range and which is prevented from being reduced in emission peak intensity and also provides a phosphor suitable for use in displays having a NTSC ratio higher than that of conventional one.

DETAILED DESCRIPTION

Figure 1:
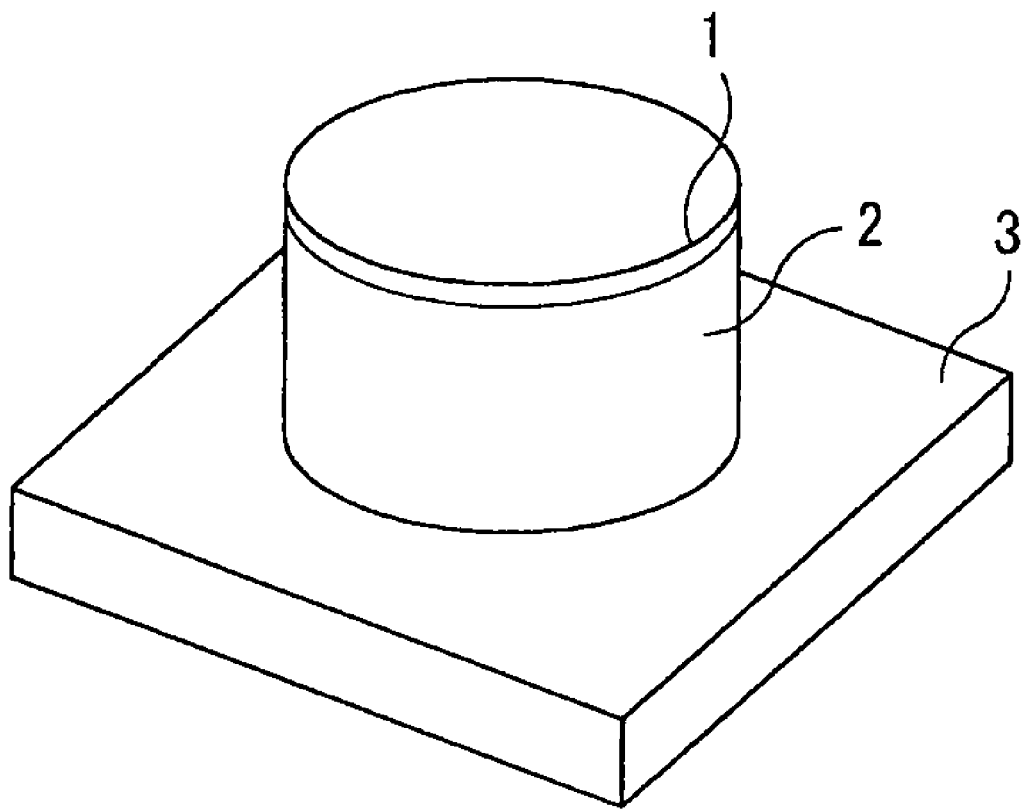
FIG. 1 is a schematic perspective view showing the relationship between an excitation light source (a first illuminator) and a phosphor-containing portion (a second illuminator) installed in an example of the light-emitting device according to the present invention.

Embodiments of the present invention will now be described in detail. The present invention is not limited to the embodiments. Various modifications may be made within the scope of the present invention.

The relationship between color and color coordinates used herein is based on the JIS standards (JIS Z 8110 and Z 8701).

The composition formulas of phosphors described herein are punctuated with pause marks (,). The fact that a plurality of elements are arranged in such a manner that the elements are punctuated with commas (,) means that one or more of the elements may be contained in each phosphor at an arbitrary ratio. For example, the composition formula "(Ca, Sr, Ba)Al$_2$O$_4$:Eu" collectively refers to all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu", and "Ca$_{1-x-y}$Sr$_x$Ba$_y$Al$_2$O$_4$:Eu", wherein 0<x<1, 0<y<1, and 0<x+y<1.

[1. Inorganic Compound (Phosphor)]

[1-1. Composition of Inorganic Compound (Phosphor)]

An inorganic compound produced by a method according to the present invention is represented by the following formula:

$$M1_aM2_bAlSiX_3 \quad (I)$$

wherein M1 represents an activation element containing at least Eu, M2 represents one or more selected from alkaline-earth metal elements, X represents one or more selected from the group consisting of O and N, and a and b each represent a positive number satisfying the inequalities $0<a\leq0.1$ and $0.8\leq a+b\leq 1$.

In Formula (I), M1 is the activation element, which contains at least Eu.

M1 is at least one transition metal element or rare earth element selected from the group consisting of Mn, Ce, Pr, Nd, Sm, Tb, Dy, Ho, Er, Tm, and Yb other than Eu.

M1 may contain one of these elements or two or more of these elements at an arbitrary ratio. Eu usually occupies 50 mole percent or more, preferably 80 mole percent or more, more preferably 90 mole percent or more, further more preferably 95 mole percent or more of M1. In particular, only Eu is preferably used.

The activation element M1 is present in the inorganic compound (phosphor) according to the present invention in the form of a bivalent cation and/or a trivalent cation. For the activation element M1, the abundance ratio of the bivalent cation is preferably high. In particular, when M1 is Eu, the percentage of Eu$^{2+}$ in Eu is usually 20 mole percent or more, preferably 50 mole percent or more, more preferably 80 mole percent or more, and further more preferably 90 mole percent or more.

The percentage of Eu$^{2+}$ in Eu contained in the phosphor according to the present invention can be determined by, for example, X-ray absorption fine structure analysis. That is, the measurement of the L3 absorption edge of Eu atoms shows different peaks each corresponding to Eu$^{2+}$ or Eu$^{3+}$ and therefore the percentage of Eu$^{2+}$ can be determined from the area of the peak corresponding to Eu$^{2+}$. The percentage of Eu$^{2+}$ in Eu contained in the phosphor according to the present invention can also be determined by electron spin resonance (ESR).

In Formula (I), a is a number within the range $0<a\leq0.1$. In order to allow the phosphor to have an emission peak at a longer wavelength, a is preferably 0.01 or more, more preferably 0.015 or more, and further more preferably 0.02 or more. In order to prevent the reduction of the emission intensity of the phosphor, a is preferably 0.05 or less, more preferably 0.045 or less, further more preferably 0.04 or less, and particularly preferably 0.035 or less.

M2 described above represents one or more selected from alkaline-earth metal elements such as Mg, Ca, Sr, and Ba. M2 is preferably Mg, Ca, and Sr, more preferably Mg and Ca, and particularly preferably Ca.

M2 may any one of these elements or may contain two or more these elements at any ratio. Ma preferably contains at least Ca. The percentage of Ca in M2 is usually 50 mole percent or more, preferably 80 mole percent or more, more preferably 90 mole percent or more, and further more preferably 95 mole percent or more. In particular, Ma preferably contains only Ca.

In Formula (I), b is a number satisfying the inequality $0.8\leq a+b\leq 1$.

In usual, the phosphor according to the present invention theoretically satisfies the equation a+b=1. An element represented by M2 may be lost together with oxygen or nitrogen. Therefore, in Formula (I), the sum a+b may be less than 1. The inequality $0.8\leq a+b\leq 1$ usually holds and the inequality $0.85\leq a+b\leq 1$ may hold.

In Formula (I), X is one or more selected from the group consisting of O and N. X may contain only O or N or may contain O and N. X may partially contain a halogen in addition to O and/or N unless its performance is affected. The content of the halogen in X is usually one mole percent or less.

X preferably contains at least N. N usually occupies 90 mole percent or more, preferably 97 mole percent or more, more preferably 99 mole percent or more, and further more preferably 99.5 mole percent or more of X. In particular, X preferably contains only N.

Components of the inorganic compound represented by Formula (I) may be partially replaced with boron, carbon, iron, copper, nickel, cobalt, chromium, zinc, molybdenum, manganese, tungsten, an alkali metal element such as sodium, or a rare-earth element other than the activation element because of an impurity in a source material or firing conditions (a crucible used and the like). In this case, the content of the impurity is usually ten mole percent or less, preferably five mole percent or less, more preferably three mole percent or less, and further more preferably one mole percent or less of an unreplaced element and is usually 0.0001 mole percent or more of the unreplaced element.

[1-2. Properties of Inorganic Compound]

The inorganic compound (hereinafter referred to as "Inorganic Compound (I)" in some cases), which is produced by the method according to the present invention and represented by Formula (I), has properties below and functions as a phosphor.

[1-2-1. Emission Spectrum Properties]

In the case where the emission spectrum of Inorganic Compound (I) is measured by exciting Inorganic Compound (I) with 455-nm wavelength light, the emission peak wavelength $\lambda_p$ (nm) of Inorganic Compound (I) is usually 650 nm or more, preferably 655 nm or more, and more preferably 660 nm or more. Therefore, if Inorganic Compound (I) is used as a red phosphor for use in displays, a display having a high NTSC ratio can be achieved. The upper limit of the emission peak wavelength $\lambda_p$ thereof is usually 680 nm or less.

In Inorganic Compound (I), the full width at half maximum (hereinafter referred to as "FWHM" in some cases) of an emission peak in the emission spectrum is usually 80 nm or more and less than 105 nm. The FWHM thereof is preferably 100 nm or less and more preferably 95 nm or less.

When the FWHM thereof is excessively large, the color reproducibility of a display can be low due to a reduction in color purity if Inorganic Compound (I) is used for the display as a red phosphor.

The emission peak intensity of Inorganic Compound (I), according to the present invention, excited with 455-nm wavelength light is usually greater than that of the product BR-101A (Lot No. STD001), available from Mitsubishi Chemical Corporation, excited therewith. Suppose that the peak intensity of the product BR-101A (Lot No. STD001) is 100, the emission peak intensity of Inorganic Compound (I) excited with 455-nm wavelength light is preferably 106 or more, more preferably 110 or more, further more preferably 115 or more. For phosphor use, it is advantageous that the emission peak intensity thereof is large. The emission peak intensity thereof is usually 150 or less.

[1-2-2. Internal Quantum Efficiency and the Like]

The internal quantum efficiency of Inorganic Compound (I), which is produced by the method according to the present invention, is usually 0.71 or more, preferably 0.75 or more, more preferably 0.80 or more, and further more preferably 0.85 or more. When the emission peak wavelength of Inorganic Compound (I) is within a range from 655 to 665 nm, the internal quantum efficiency thereof is very high and is preferably 0.80 or more, more preferably 0.85 or more, and further more preferably 0.90 or more. The term "internal quantum efficiency" used herein means the ratio of the number of photons of the excitation light absorbed by a phosphor to the number of photons of the light emitted from the phosphor. A reduction in internal quantum efficiency may lead to a reduction in light emission efficiency.

Inorganic Compound (I) preferably has high absorption efficiency. The absorption efficiency thereof is usually 0.80 or more, preferably 0.85 or more, more preferably 0.90 or more, and further more preferably 0.93 or more. A reduction in absorption efficiency may lead to a reduction in light emission efficiency.

The external quantum efficiency of Inorganic Compound (I) is usually 0.67 or more, preferably 0.70 or more, more preferably 0.72 or more, further more preferably 0.75 or more, particularly preferably 0.77 or more, and most preferably 0.78 or more. When the emission peak wavelength of Inorganic Compound (I) is within a range from 655 to 665 nm, the external quantum efficiency thereof is very high and is 0.75 or more. When the external quantum efficiency is extremely small, it can be difficult to design a light-emitting device having high emission intensity.

(Techniques for Measuring Absorption Efficiency, Internal Quantum Efficiency, and External Quantum Efficiency)

Techniques for determining the absorption efficiency $\alpha q$, internal quantum efficiency $\eta i$, and external quantum efficiency $\eta o$ of an inorganic compound (phosphor) are described below.

A sample (for example, powder) of a phosphor to be measured is packed into a cell such that the surface of the packed phosphor sample is smoothed in order to keep the accuracy of measurement. The cell is attached to a light collector such as an integrating sphere. The reason why the light collector is used is to count the number of photons reflected by the phosphor sample and the number of photons emitted from the phosphor sample by fluorescence, that is, to prevent uncounted photons from leaking out of the measuring system.

A light source for exciting the phosphor is attached to the light collector. The light source is, for example, a Xe lamp and is adjusted to emit monochromatic light with a peak wavelength of, for example, 455 nm using a filter, a monochromator (grating spectroscope), or the like. The light emitted from the light source, of which the emission peak wavelength is adjusted, is applied to the phosphor sample and the spectrum of emitted light (fluorescent light) and reflected light is measured with a spectrometer, for example, spectrometer MCPD 2000 or MCPD 7000 available from Otsuka Electronics Co., Ltd. The obtained spectrum covers a reflected portion of the light (hereinafter simply referred to as "excitation light") emitted from the light source and also covers the light (fluorescent light), emitted from the phosphor absorbing the excitation light, having a wavelength different from that of the excitation light, the reflected light portion being not absorbed by the phosphor. A wavelength region near the excitation light corresponds to a reflection spectrum and a longer wavelength region corresponds to a fluorescent spectrum (herein referred to as "emission spectrum" in some cases).

The absorption efficiency $\alpha q$ of the phosphor is a value obtained by dividing the number $N_{abs}$ of photons of a portion of the excitation light that is absorbed by the phosphor sample by the number N of all photons of the excitation light.

The number N of all photons of the excitation light is determined as described below. A reflective plate is used as a measurement object. The reflective plate is made of a reflective material, such as Spectralon (which has a reflectivity R of 98% with respect to excitation light with a wavelength of 450 nm) available from Labsphere, having a reflectivity R of about 100% with respect to excitation light. The reflective plate is attached to the light collector so as to be located at the same position as that of the phosphor sample. The reflection spectrum $I_{ref}$ of the reflective plate is measured with the spectrometer. The value of Function (4) that is obtained from the reflection spectrum $I_{ref}(\lambda)$ is proportional to N.

(Function 4)

$$\frac{1}{R}\int \lambda \cdot I_{ref}(\lambda)d\lambda \qquad [M1]$$

The above function may be integrated over an interval in which $I_{ref}(\lambda)$ has a significant value.

The number of photons of the excitation light portion absorbed by the phosphor sample is proportional to the value given by Function (5) below.

(Function 5)

$$\frac{1}{R}\int \lambda \cdot I_{ref}(\lambda)d\lambda - \int \lambda \cdot I(\lambda)d\lambda \qquad [M2]$$

In the above function, $I(\lambda)$ represents the reflection spectrum obtained by attaching the phosphor sample, which is to be determined for absorption efficiency $\alpha q$. Since the integration interval is limited, the second term of Function (5) corresponds to the number of photons generated by reflecting the excitation light by the phosphor sample, which is a measurement object, that is, the second term of Function (5) corresponds to the value obtained by subtracting the number of photons resulting from fluorescence from the number of all photons generated from the phosphor sample. Since the measurements of an actual spectrum are usually obtained in the form of digital data separated for each limited band relating to $\lambda$, the integrals of Functions (4) and (5) are given by a finite sum based on the band.

Therefore, the equation $\alpha q = N_{abs}/N = $ Function (5)/Function (4) is obtained.

A technique for determining the internal quantum efficiency $\eta i$ is described below. The internal quantum efficiency $\eta i$ is a value obtained by dividing the number $N_{PL}$ of the photons resulting from fluorescence by the number $N_{abs}$ of photons absorbed by the phosphor sample.

The number $N_{PL}$ is proportional to the value given by Function (6) below.

(Function 6)

$$\int \lambda \cdot I(\lambda)d\lambda \qquad [M3]$$

The integration interval of the above function is limited to the range of the wavelength of the photons resulting from the fluorescence of the phosphor sample. This is because the contribution of photons reflected by the phosphor sample is subtracted from $I(\lambda)$. In particular, the lower limit of the integration interval of Function (6) is the upper limit of the integration interval of Function (4) and the upper limit of the integration interval of Function (6) is within a range sufficient to cover the photons resulting from the fluorescence thereof.

Therefore, the internal quantum efficiency $\eta i$ is given by the equation $\eta i = $ Function (6)/Function (5).

The integration of a spectrum obtained in the form of digital data is performed in substantially the same manner as that for determining the absorption efficiency $\alpha q$.

The external quantum efficiency ηo is obtained by multiplying the absorption efficiency αq and internal quantum efficiency ηi obtained as described above. Alternatively, the external quantum efficiency ηo can be obtained from the relationship ηo=Function (6)/Function (4). The external quantum efficiency ηo is a value obtained by dividing the number $N_{PL}$ of the photons resulting from fluorescence by the number N of all photons of the excitation light.

[1-2-3. Wavelength of Excitation Light]

In usual, Inorganic Compound (I), which is produced by the method according to the present invention, can be excited with light having a wavelength of 200 to 500 nm. In particular, Inorganic Compound (I) can be excited with blue light (a wavelength of 420 to 500 nm) and/or ultraviolet light (a wavelength of 300 to 420 nm). Hence, Inorganic Compound (I) is suitable for use in a light-emitting device including a semiconductor device serving as a first light emitter. The light emitted from the semiconductor device is used to excite a phosphor.

[1-2-4. Color of Emitted Light]

The light emitted from Inorganic Compound (I), which is produced by the method according to the present invention, usually has an x-color coordinate of 0.65 or more, preferably 0.66 or more, more preferably 0.67 or more, and further more preferably 0.68 or more. The x-color coordinate thereof is usually 0.70 or less. The y-color coordinate thereof is usually 0.35 or less, preferably 0.33 or less, and more preferably 0.32 or less and is usually 0.29 or more. The x- and y-color coordinates are based on JIS Z 8701.

[1-2-5. Form and Weight-Average Median Diameter of Crystal Grains]

Inorganic Compound (I), which is produced by the method according to the present invention, contains crystal grains having a unique crystalline form, that is, an aspect ratio of three or more. The aspect ratio of the crystal grains can be determined in such a manner that the crystal grains are observed with a scanning electron microscope (SEM) and the length of the longitudinal axis of Inorganic Compound (I) is divided by the length of a portion which is perpendicular to the longitudinal axis thereof and which has the largest thickness.

Inorganic Compound (I) contains the crystal grains, which has such a unique crystalline form, that is, an aspect ratio of three or more. The aspect ratio is determined in such a manner that 50 or more of the crystal grains are observed with the SEM. The content of the crystal grains therein is preferably 1% or more, more preferably 5% or more, and more preferably 10% or more. Inorganic Compound (I) usually contains 30% or more, preferably 50% or more, and more preferably 70% or more of crystal grains having an aspect ratio of two or more.

The weight-average median diameter $D_{50}$ of Inorganic Compound (I) is usually 0.01 μm or more, preferably 1 μm or more, more preferably 5 μm or more, and further more preferably 10 μm or more. The weight-average median diameter $D_{50}$ thereof is usually 100 μm or less, preferably 30 μm or less, and more preferably 20 μm or less. When the weight-average median diameter $D_{50}$ of Inorganic Compound (I) is extremely small, the brightness of Inorganic Compound (I) is low and particles of Inorganic Compound (I) are likely to agglomerate. On the other hand, when the weight-average median diameter $D_{50}$ of Inorganic Compound (I) is extremely large, nonuniform coatings may be formed or dispensers or the like may be clogged.

The particle size distribution parameter QD of Inorganic Compound (I) is usually 0.5 or less, preferably 0.3 or less, and more preferably 0.25 or less and is usually 0.1 or more. For phosphor use, when a plurality of Inorganic Compounds (I) having different weight-average median diameters $D_{50}$ are used in combination to achieve increased light emission efficiency and light absorption efficiency, the particle size distribution parameter QD of a mixture of Inorganic Compounds (I) may be greater than 0.3.

According to the present invention, the weight-average median diameter $D_{50}$ can be determined with an analyzer such as a laser diffraction-scattering particle size distribution analyzer.

The weight-average median diameter $D_{50}$ is a value obtained from a modal particle size distribution curve. The modal particle size distribution curve can be obtained by determining particle size distribution by a laser diffraction-scattering technique. In particular, the modal particle size distribution curve can be obtained in such a manner that Inorganic Compound (I) is dispersed in an aqueous solution containing a dispersant and the dispersion is measured with a laser diffraction-scattering particle size distribution analyzer (Type 1064 available from CILAS) within a particle size range from 0.04 to 500 μm. In the modal particle size distribution curve, the particle size corresponding to a cumulative value of 50% is defined as a weight-average median diameter $D_{50}$. The particle size corresponding to a cumulative value of 25% and that corresponding to a cumulative value of 75% are represented by $D_{25}$ and $D_{75}$, respectively. The standard deviation (quartile deviation) is defined as $QD=(D_{75}-D_{25})/(D_{75}+D_{25})$. A reduction in QD leads to a narrow particle size distribution.

[1-2-6. Temperature Quenching]

Inorganic Compound (I), which is produced by the method according to the present invention, has excellent property about temperature quenching. In particular, the ratio of the intensity of an emission peak in the emission spectrum of Inorganic Compound (I) irradiated with 455-nm wavelength light at 150° C. to the intensity of an emission peak in the emission spectrum of Inorganic Compound (I) irradiated therewith at 25° C. is usually 55% or more, preferably 60% or more, and more preferably 70% or more.

Although it is unlikely that the above ratio exceeds 100% because an increase in temperature reduces the intensity of the light emitted from an ordinary phosphor, the above ratio may exceed 100% for any reason. However, when the above ratio exceeds 150%, a change in temperature tends to cause color shift.

Inorganic Compound (I), which is produced by the method according to the present invention, is excellent in brightness in addition to the above emission peak intensity. In particular, the ratio of the brightness of Inorganic Compound (I) irradiated with 455-nm wavelength light at 150° C. to that of Inorganic Compound (I) irradiated therewith at 25° C. is usually 55% or more, preferably 60% or more, and more preferably 70% or more.

The above temperature quenching can be measured with, for example, a fluorescence spectrometer with a temperature-adjusting function such as the spectrometer FP-6500, available from Japan Spectroscopy Co., Ltd., equipped with a temperature adjuster option (HPC-503) available from the company in such a manner that the temperature of Inorganic Compound (I) is varied within a range from 25° C. to 150° C. as described below.

After it is confirmed that the temperature of Inorganic Compound (I) (or a phosphor having the same crystalline phase as that of Inorganic Compound (I)) becomes constant, Inorganic Compound (I) (or the phosphor) is excited with 455-nm wavelength light extracted from a light source through a diffraction grating and then measured for emission spectrum. The emission peak intensity is determined from the obtained emission spectrum. The temperature of Inorganic Compound (I) (or a phosphor containing Inorganic Compound (I)) is measured with a thermocouple placed in HPC-503.

[1-2-7. Durability]

Inorganic Compound (I), which is produced by the method according to the present invention, is usually stable for 200 hours or more, preferably 500 hours or more, more preferably 600 hours or more, and further more preferably 800 hours or more during a durability test performed in an atmosphere having a temperature of 85° C. and a relative humidity of 85%. In the durability test, the stable time of Inorganic Compound (I) is preferably long. In usual, it is sufficient that the stable time is 1000 hours. The term "stable" used herein means that the ratio of the emission peak intensity of Inorganic Compound (I) subjected to the durability test to that of Inorganic Compound (I) unsubjected to the durability test is 50% or more and preferably means that the change in the emission peak intensity of Inorganic Compound (I) allowed to stand for about 1000 hours in an atmosphere having a temperature of 85° C. and a relative humidity of 85% is within a range from −10% to 10% and, in an XYZ color system, the changes in the color coordinates CIEx and CIEy of Inorganic Compound (I) allowed to stand as described above are within a range from −0.005 to 0.005. The durability thereof can be measured with an LED aging system available from Yamakatsu Electronics Industry Co., Ltd. in such a manner that Inorganic Compound (I) is placed in an atmosphere having a temperature of 85° C. and a relative humidity of 85% and is supplied with a current of 20 mA. The durability thereof may be measured with a similar system.

[1-2-3. XRD Pattern]

Figure 4:
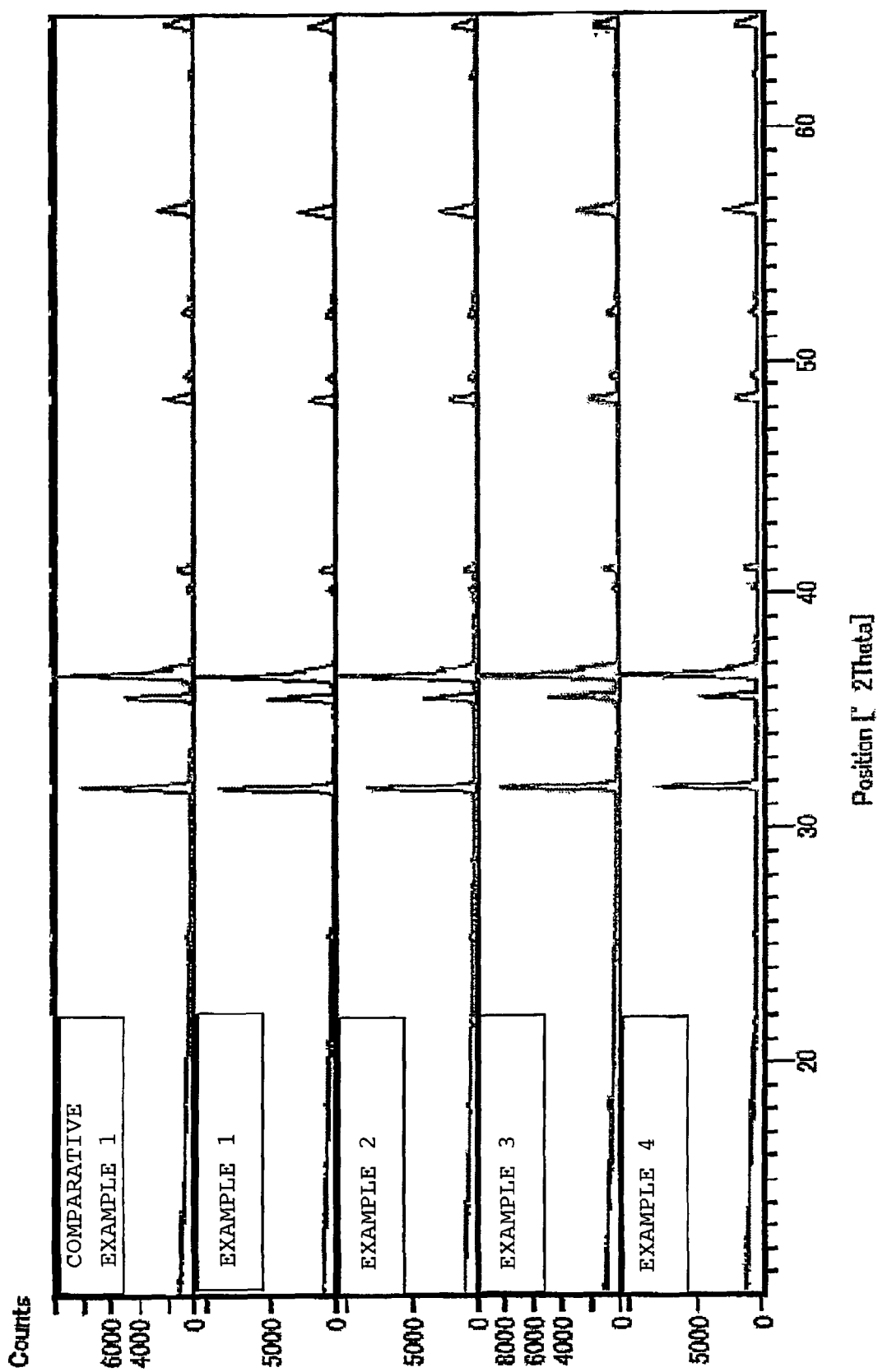
FIG. 4 is a graph showing the X-ray diffraction patterns of phosphors (inorganic compounds) obtained as described in Comparative Example 1 and Examples 1 to 4.

Inorganic Compound (I) exhibits an XRD pattern (X-ray diffraction pattern), shown in FIG. 4, obtained with an X-ray diffractometer equipped with a CuKα X-ray source.

[1-3. Uses of Inorganic Compound]

Inorganic Compound (I), which is produced by the method according to the present invention, can be used for any applications using a phosphor. In particular, Inorganic Compound (I) is suitable for use in various light-emitting devices (for example, "a light-emitting device according to the present invention" described below) because Inorganic Compound (I) can be excited with blue or near-ultraviolet light.

Light-emitting devices emitting light of various colors can be manufactured by varying the type and/or amount of a phosphor used in combination with Inorganic Compound (I). Since Inorganic Compound (I) is a phosphor (deep-red phosphor) emitting deep-red fluorescent light, a light-emitting device emitting white light can be manufactured in such a manner that Inorganic Compound (I) is used in combination with an excitation light source emitting blue light and a phosphor (green phosphor) emitting green fluorescent light. The color of the light emitted from the white light-emitting device can be desirably controlled by varying the wavelength of the light emitted from the green phosphor or a phosphor containing Inorganic Compound (I) according to the present invention and/or the mixing ratio of the green phosphor and the phosphor containing Inorganic Compound (I). Alternatively, the white light-emitting device can be manufactured in such a manner that the phosphor containing Inorganic Compound (I) according to the present invention is used in combination with a phosphor (blue phosphor) emitting blue fluorescent light to prepare an excitation light source emitting blue light.

Since Inorganic Compound (I), which is produced by the method according to the present invention, emits light with a long peak wavelength and has high internal quantum efficiency, the light-emitting device has a high NTSC ratio and high efficiency when the light-emitting device contains Inorganic Compound (I).

The color of the light emitted from a light-emitting device is not limited to white. A light-emitting device emitting light of any color can be manufactured in such a manner that a yellow phosphor (a phosphor emitting yellow fluorescent light), the blue phosphor, an orange or red phosphor (a phosphor emitting orange or red fluorescent light), the green phosphor, and the like are used in combination and/or the types and/or mixing ratio of these phosphors are varied as required. The light-emitting device manufactured as described above can be used as a light-emitting section (in particular, a backlight for liquid crystal displays) included in a display or a lighting system.

[2. Method for Producing Inorganic Compound]

The method according to the present invention is characterized in that the following feedstock is used to produce Inorganic Compound (I) represented by Formula (I): a feedstock which is prepared in such a manner that compounds which are sources of Al, Si, the element represented by M1, and the element represented by M2 are mixed together depending on a target composition such that the amount of Si is greater than one mole and less than 1.14 moles per mole of Al, that is, the amount of Si is slightly less than the theoretical amount determined from Formula (I).

Inorganic Compound (I) according to the present invention has a composition in which the molar ratio of (M1+M2) to Al to Si to X is usually (0.8 to 1):1:1:3. According to the present invention, the feedstock is prepared such that the molar ratio of Si to Al is greater than one and less than 1.14. The Si-to-Al molar ratio is preferably 1.12 or less, more preferably 1.11 or less, and further more preferably 1.10 or less. The Si-to-Al molar ratio is preferably 1.01 or more, more preferably 1.03 or more, and further more preferably 1.05 or more.

If the feedstock is prepared such that the Si-to-Al ratio is greater than one, Inorganic Compound (I) obtained by firing the feedstock exhibits the X-ray diffraction pattern shown in FIG. 4 and satisfies Formula (I) (that is, Si/Al=1). If the feedstock, in which the Si-to-Al ratio is greater than one and less than 1.14, is used, a phosphor having the same composition formula as that of a phosphor obtained from a feedstock satisfying the equation Si/Al=1 is obtained. Although the reason why that phosphor has excellent properties is unclear, some differences are probably caused in extremely fine crystal microstructures even if the composition formulas are the same; hence, the phosphors have different properties.

A source material and method used to produce Inorganic Compound (I) are not particularly limited. A known method may be used or such a known method and a known source material may be used in combination. Inorganic Compound (I) can be produced in such a manner that, for example, a source (hereinafter referred to as "M1 source") of M1 that is an activation element, a source (hereinafter referred to as "M2 source") of M2 that is an alkaline-earth metal element, a source (hereinafter referred to as "Al source") of Al, and a source (hereinafter referred to as "Si source") of Si are mixed together (a mixing step) and the obtained mixture is fired (a firing step).

In particular, the M1 source, the M2 source, the Al source, and the Si source are weighed such that a composition represented by Formula (I) is obtained and the above Si-to-Al ratio is obtained. After the M1, M2, Al, and Si sources are sufficiently mixed together in a ball mill or the like, the mixture is packed into a container such as a crucible and then fired at a predetermined temperature in a predetermined atmosphere. The fired mixture is pulverized and then cleaned as required, whereby Inorganic Compound (I) according to the present invention can be obtained.

A source compound containing the above elements may be used.

[2-1. Raw Materials]

Examples of raw materials (that is, the M1, M2, Al, and Si sources, which are hereinafter referred to as "phosphor sources" in some cases) used to produce Inorganic Compound (I) include alloys, imides, oxynitrides, nitrides, oxides, hydroxides, carbonates, nitrates, sulfates, oxalates, and halides of M1, M2, Al, or Si and metallic M1, M2, Al, and Si. The raw materials may be arbitrarily selected from these compounds in consideration of reactivity, the amount of $NO_x$, $SO_x$, or the like generated during firing. The raw materials may be used alone or in combination at an arbitrarily ratio depending on elements contained in Inorganic Compound (I).

Impurities contained in each source compound for Inorganic Compound (I) according to the present invention are not particularly limited as long as the impurities have no adverse effect on properties of Inorganic Compound (I), particularly on phosphor properties thereof. The content of each of Fe, Co, Cr, and Ni is usually 1000 ppm by weight or less, preferably 100 ppm by weight or less, more preferably 50 ppm by weight or less, further more preferably 10 ppm by weight or less, and particularly preferably 1 ppm by weight or less.

Furthermore, the content of oxygen, which is an impurity, in each raw material is usually 3% by weight or less, preferably 1% by weight or less, more preferably 0.5% by weight or less, and further more preferably 500 ppm by weight or less. The lower limit of the content of oxygen in the raw material is usually 1 ppm by weight or more because of the influence of the surface oxidation of the raw material.

The weight-average median diameter $D_{50}$ of each source compound is usually 0.1 μm or more and preferably 0.5 μm or more. The weight-average median diameter $D_{50}$ thereof is usually 30 μm or less, preferably 20 μm or less, more preferably 10 μm or less, and further more preferably 3 μm or less. Therefore, the source compound may be pulverized with a dry pulverizer such as a jet mill in advance depending on the type of the source compound. This allows the source compound to be uniformly dispersed in a raw material mixture and also allows the source compound to have an increased surface area; hence, the solid phase reactivity of the raw material mixture can be enhanced and an impurity phase can be prevented from being formed. A nitride source material used preferably has a particle size less than that of other source compounds.

When the source compounds are deliquescent, the source compounds are preferably used in the form of anhydride.

Examples of an Eu source that is an example of the M1 source include $Eu_2O_3$, $Eu_2(SO_4)_3$, $EU_2(C_2O_4)_3.10H_2O$, $EuF_2$, $EuF_3$, $EuCl_2$, $EuCl_3$, $Eu_2(NO_3)_3.6H_2O$, EuN, and EuNH. In particular, an oxide or a halide is preferable, such a halide is more preferable, and $EuF_3$ is particularly preferable.

Examples of sources of other activation elements such as Mn, Ce, Pr, Nd, Sm, Tb, Dy, Ho, Er, Tm, and Yb include compounds obtained by replacing Eu in the above compounds that are the Eu source examples with Mn, Ce, Pr, Nd, Sm, Tb, Dy, Ho, Er, Tm, or Yb.

Examples of a Ba source that is an example of the M2 source include BaO, $Ba(OH)_2.8H_2O$, $BaCO_3$, $Ba(NO_3)_2$, $BaSO_4$, $Ba(C_2O_4)$, $Ba(OCOCH_3)_2$, $BaF_2$, $BaCl_2$, $Ba_3N_2$, and BaNH. In particular, $Ba_3N_2$ is preferable.

Examples of a Sr source that is an example of the M2 source include SrO, $Sr(OH)_2.8H_2O$, $SrCO_3$, $Sr(NO_3)_2$, $SrSO_4$, $Sr(C_2O_4).H_2O$, $Sr(OCOCH_3)_2.0.5H_2O$, $SrF_2$, $SrCl_2$, $Sr_3N_2$, and SrNH. In particular, $Sr_3N_2$ is preferable.

Examples of a Mg source include MgO, $Mg(OH)_2$, basic magnesium carbonate $(mMgCO_3.Mg(OH)_2.nH_2O)$, $Mg(NO_3)_2.6H_2O$, $MgSO_4$, $Mg(C_2O_4).2H_2O$, $Mg(OCOCH_3)_2.4H_2O$, $MgF_2$, $MgCl_2$, $Mg_3N_2$, and MgNH. In particular, $Mg_3N_2$ is preferable.

Examples of a Ca source include CaO, $Ca(OH)_2$, $CaCO_3$, $Ca(NO_3)_2.4H_2O$, $CaSO_4.2H_2O$, $Ca(C_2O_4).H_2O$, $Ca(OCOCH_3)_2.H_2O$, $CaF_2$, $CaCl_2$, $Ca_3N_2$, and CaNH. In particular, $Ca_3N_2$ is preferable.

AlN is preferably used as an Al source compound.

$SiO_2$ or $Si_3N_4$ is preferably used as a Si source compound. Alternatively, a compound producing $SiO_2$ during reaction may be used. Examples of such a compound include $SiO_2$, $H_4SiO_4$, and $Si(OCOCH_3)_4$. $Si_3N_4$ preferably has a small particle size and high purity in view of reactivity and light emission efficiency, respectively. In view of light emission efficiency, $β-Si_3N_4$ is more preferable than $α-Si_3N_4$. $Si_3N_4$ preferably contains a smaller amount of carbon, which is an impurity. Although it is preferable that the content of carbon in $Si_3N_4$ be small, the content of carbon therein is usually 0.001% by weight or more. The content of carbon therein is usually 0.3% by weight or less, preferably 0.1% by weight or less, and more preferably 0.05% by weight or less.

In order to enhance the light emission efficiency of Inorganic Compound (I) (the phosphor containing Inorganic Compound (I)), the phosphor sources preferably have high purity and a high degree of whiteness. The phosphor sources preferably have a reflectivity of 60% or more, more preferably 70% or more, and further more preferably 80% or more at a wavelength of 380 to 780 nm. In particular, the phosphor sources preferably have a reflectivity of 60% or more, more preferably 70% or more, further more preferably 80% or more, and particularly preferably 90% or more at a wavelength of 525 nm, which is close to the emission peak wavelength of the phosphor containing Inorganic Compound (I) according to the present invention.

$Si_3N_4$, which is an example of the phosphor sources, preferably has high reflectivity. $Si_3N_4$ having high reflectivity contains carbon, which is an impurity. The content of carbon in $Si_3N_4$ is usually 0.2% by weight or less, preferably 0.1% by weight or less, more preferably 0.05% by weight or less, and further more preferably 0.03% by weight or less. Although it is preferable that the content of carbon be small, the content of carbon is usually 0.001% by weight or more.

In order to determine the reflectivity of each phosphor source, the phosphor source may be measured for reflection spectrum. A technique for determining the reflectivity thereof may be the same as that specified in one of the above descriptions of the absorption efficiency, the internal quantum efficiency, and the external quantum efficiency.

The M1, M2, Al, and Si sources may be used alone or may be used in combination at an arbitrary ratio.

An X source is an anionic component of the M1, M2, Al, or Si source or a component contained in a firing atmosphere and is supplied during the production of Inorganic Compound (I).

[2-2. Mixing Step]

A technique for mixing the phosphor sources is not particularly limited. In particular, a mixing technique using, for example, a dry pulverizer such as a hammer milling, a roll milling, a ball milling, or a jet milling or a pestle and mortar may be used in combination with a mixing technique using, for example, a mixer such as a ribbon blender, a V-shaped blender, or a Henschel mixer or a pestle and mortar. Any known technique, such as a dry mixing technique, for pulverizing and mixing the phosphor sources may be arbitrarily used. Conditions for mixing the phosphor sources may be arbitrarily selected from known conditions. For example, a ball milling containing two types of balls having different sizes may be used to mix the phosphor sources.

The raw materials are preferably mixed together with a mixer placed in a $N_2$ glove box of which the moisture content is controlled such that the nitride source material is not deteriorated by moisture. The moisture content of the atmosphere in the glove box is desirably 10000 ppm by weight or less, preferably 1000 ppm by weight or less, more preferably 10 ppm by weight or less, and further more preferably 1 ppm by weight or less. The oxygen content of the atmosphere is desirably 1% by weight or less, preferably 1000 ppm by weight or less, more preferably 100 ppm by weight or less, and particularly preferably 10 ppm by weight or less.

The raw materials may be sieved during the above mixing/pulverizing operation as required. In this case, any one of various commercially available sieves can be used and a resin sieve, such as a nylon mesh sieve, used is more preferable than a metal mesh sieve because contamination can be prevented.

In order to enhance the solid phase reactivity of the raw material mixture and in order to prevent the formation of an impurity phase, it is preferable the nitride source material be uniformly dispersed in the raw material mixture. In order to achieve the dispersion, the following procedure may be used: the raw materials other than the nitride source material are mixed together in advance, the mixture is fired and then pulverized, the nitride source material is blended with the resulting mixture, and the blend is fired. The nitride source material is particularly preferably pulverized with a dry pulverizer such as a jet mill, because particles of the nitride source material have an increased surface area, which leads to an increase in the solid phase reactivity the nitride source material. Although these techniques illustrated above may be used alone, these techniques are preferably used in combination.

[2-3. Firing Step]

In order to fire the obtained blend, the raw material mixture is packed into heat-resistant containers such as crucibles or trays made of a material insensitive to the raw materials. Examples of a material for forming the heat-resistant containers include ceramic materials such as alumina, quartz, boron nitride, silicon nitride, silicon carbide, magnesium, and mullite; metals such as platinum, molybdenum, tungsten, tantalum, niobium, iridium, and rhodium; alloys principally containing any one of these metals; and carbon (graphite).

The heat-resistant containers are preferably made of boron nitride, alumina, silicon nitride, silicon carbide, platinum, molybdenum, tungsten, or tantalum; more preferably boron nitride, alumina, or molybdenum; and particularly preferably boron nitride or molybdenum.

The heat-resistant containers may be subjected to pretreatment such as pre-burning in advance of firing as required.

The filling factor (hereinafter referred to as "heat-resistant container-filling factor) of the heat-resistant containers containing the raw material compound depends on firing conditions and may be determined such that the pulverization of a fired product is not prevented. The filling factor thereof is usually 10% to 90% by volume. Gaps are present between particles of the raw material compound packed in a crucible. The actual volume of the raw material compound is usually 10 ml or more, preferably 15 ml or more, and more preferably 20 ml or more and is usually 50 ml or less, preferably 40 ml or less, and more preferably 30 ml or less per 100 ml of a space filled with the raw material compound.

If the amount of the raw material compound treated in one batch needs to be increased, the heating rate of the heat-resistant containers is reduced such that the heat-resistant containers are uniformly heated.

The filling factor (hereinafter referred to as "furnace filling factor") of a furnace in which the heat-resistant containers are placed is preferably determined such that the heat-resistant containers placed in the furnace are not nonuniformly heated.

When the number of the heat-resistant containers placed in the furnace is large, the heat-resistant containers placed are uniformly heated in such a manner that the heating rate of the heat-resistant containers is reduced. This is preferable to perform uniform firing.

In a portion of a heating process during firing, vacuum conditions are preferably maintained. In particular, a vacuum (in particular, a pressure of $10^{-2}$ Pa to less than 0.1 MPa) is preferably maintained at a temperature of room temperature to 1500° C., more preferably room temperature to 1200° C., and further more preferably room temperature to 1000° C. Heating is particularly preferably performed in such a state that an inert or reducing gas described below is introduced into a system maintained at a reduced pressure.

The above temperature in the heating process is preferably held for one minute or more, more preferably five minutes or more, and further more preferably ten minutes or more during the introduction of the above gas. The holding time is usually five hours or less, preferably three hours or less, and more preferably one hour or less.

In the firing step, a powder fired at a temperature exceeding 2000° C. is sintered and therefore has low emission intensity; however, a powder fired at a temperature of 1700° C. to 1800° C. has good crystallinity. Therefore, a firing temperature for producing Inorganic Compound (I) is usually 1000° C. or more, preferably 1300° C. or more, and more preferably 1500° C. or more and is usually 1900° C. or less, preferably 1850° C. or less, and more preferably 1800° C. or less.

A firing atmosphere is not particularly limited and is usually inert or reducing. Since the activation element is preferably bivalent as described above, the firing atmosphere is preferably reducing. The inert gas and the reducing gas may be used alone or in combination at an arbitrary ratio.

Examples of the inert gas include nitrogen and argon and examples of the reducing gas include carbon monoxide and hydrogen. The firing atmosphere preferably contains nitrogen and more preferably a nitrogen gas containing hydrogen. The nitrogen ($N_2$) gas preferably has a purity of 99.9% or more. When the hydrogen-containing nitrogen gas is used, the concentration of oxygen in an electric furnace is preferably reduced to 20 ppm or less. The concentration of hydrogen in the firing atmosphere is preferably 1% by volume or more and more preferably 2% by volume or more. The concentration of hydrogen therein is preferably 5% by volume or less. This is because an extremely high concentration of hydrogen therein may cause a reduction in safety and an extremely low concentration of hydrogen therein may be insufficient to achieve reducibility.

The inert or reducing gas may be introduced into the system in advance of heating, during heating, or at the point of time when the firing temperature is established. The inert or reducing gas is preferably introduced thereinto in advance of heating or during heating.

Firing is performed in such a manner that the inert or reducing gas is usually supplied at a flow rate of 0.1 to 10 l/minute.

The time of firing depends on a temperature and/or pressure during firing and is usually 0.5 hour or more and preferably one hour or more. The firing time is usually 100 hours or less, preferably 50 hours or less, more preferably 24 hours or less, and further more preferably 12 hours or less.

A pressure during firing depends on the firing temperature and/or the like and therefore is not particularly limited. The pressure during firing is usually $1\times10^{-5}$ Pa or more, preferably $1\times10^{-3}$ Pa or more, more preferably 0.01 MPa or more, and further more preferably 0.1 MPa or more. The upper limit thereof is usually 5 GPa or less, preferably 1 GPa or less, more preferably 200 MPa or less, and further more preferably 100 MPa or less. In particular, the pressure during firing is preferably within a range from atmospheric pressure to about 1 MPa on an industrial basis because of low cost and manpower.

In the firing step, when the number of crucibles placed in the furnace is large, the heating rate thereof is preferably reduced such that the crucibles are uniformly heated, because nonuniform firing is prevented.

In the case where carbon monoxide or a cyanide is by-produced during firing, gas in the furnace is preferably replaced with nitrogen or an inert gas in the course of cooling the furnace once or more. In the course of cooling the furnace, the furnace may be maintained at a specific temperature.

[2-4. Flux]

In order to grow good crystals in the firing step, a flux may be present in a reaction system. The type of the flux is not particularly limited. Examples of the flux include ammonium halides such as $NH_4Cl$ and $NH_4F.HF$; alkali metal carbonates such as $NaCO_3$ and $LiCO_3$; alkali metal halides such as LiCl, NaCl, KCl, CsCl, LiF, NaF, KF, and CsF; alkaline-earth metal halides such as $CaCl_2$, $BaCl_2$, $SrCl_2$, $CaF_2$, $BaF_2$, and $SrF_2$; alkaline-earth metal oxides such as CaO, SrO, and BaO; boron oxides such as $B_2O_3$, $H_3BO_3$, and $Na_2B_4O_7$; boron compounds such as boric acid, alkali metal borates, and alkaline-earth metal borates; phosphates such as $Li_3PO_4$ and $NH_4H_2PO_4$; aluminum halides such as $AlF_3$; zinc compounds such as zinc oxide, zinc sulfide, and zinc halides including $ZnCl_2$ and $ZnF_2$; Group 15 element oxides such as $Bi_2O_3$; and alkali metal, alkaline-earth metal, or Group 13 element nitrides such as $Li_3N$, $Ca_3N_2$, $Sr_3N_2$, $Ba_3N_2$, and BN. The halides are preferable. The alkali metal halides, the alkaline-earth metal halides, and the Zn halides are particularly preferable. Among these halides, the fluorides and the chlorides are preferable.

The amount of the flux used depends on the types of the raw materials and/or the type of the flux. The amount thereof is usually 0.01% by weight or more, preferably 0.1% by weight or more, and more preferably 1% by weight or more of the amount of the phosphor sources. The amount thereof is usually 20% by weight or less and preferably 10% by weight or less. The use of an extremely large amount of the flux may cause the saturation of the effect of the flux, a change in the color of emitted light, and/or a reduction in brightness because the flux is captured in a host crystal. The flux may be used alone or two or more types of fluxes may be used in combination at an arbitrary ratio.

When the flux is deliquescent, the flux is preferably used in the form of anhydride. In the case where the Inorganic Compound (I) is produced by a multi-step firing process, the flux is used in a subsequent firing step.

[2-5. First Firing Sub-Step and Second Firing Sub-Step]

The firing step may be divided into a first firing sub-step and a second firing sub-step. That is, the raw material mixture prepared in the mixing step is primarily fired in the first firing sub-step and the resulting mixture is pulverized and then fired in the second firing sub-step.

The temperature of the first firing sub-step is arbitrary as long as advantages of the present invention are not seriously reduced. In order to protect an intermediate nitride in firing from a side reaction such as hydrolysis, it is preferable that the temperature of the first firing sub-step be not extremely low. The temperature of the first firing sub-step is usually 1000° C. or more and preferably 1300° C. or more. The temperature thereof is usually 1800° C. or less, preferably 1700° C. or less, and more preferably 1600° C. or less.

The time of the first firing sub-step is arbitrary as long as advantages of the present invention are not seriously reduced. The time of the first firing sub-step is usually one hour or more and preferably two hours or more. The time thereof is usually 100 hours or less, preferably 50 hours or less, more preferably 24 hours or less, and further more preferably 12 hours or less.

Conditions, such as temperature and time, of the second firing sub-step are substantially the same as those of the above firing sub-step.

The flux may be blended with the raw material mixture in advance of the first or second firing sub-step. Firing conditions such as atmospheres may be varied between the first and second firing sub-steps.

[2-6. Post-Treatment]

Cleaning, drying, pulverization, classification, and/or the like is performed subsequently to the above heat treatment in the firing step.

The pulverizer, which is specified in the description of the mixing step, can be used for pulverization. In order to prevent the destruction of crystal grains of Inorganic Compound (I) and in order to break secondary particles, ball mill treatment is preferably performed for ten minutes to 24 hours using a container made of alumina, silicon nitride, $ZrO_2$, or glass and balls made of such a material or urethane balls with an iron core, the balls being placed in the container. In this operation, 0.05% to 2% by weight of a dispersant such as an alkali salt of an organic acid or a phosphoric acid such as hexametaphosphoric acid may be used.

Cleaning can be performed using, for example, water such as deionized water, an organic solvent such as ethanol, an alkaline aqueous solution such as ammonium water, or the like. In order to remove the flux or impurities from a fired product and in order to enhance emission properties, an inorganic acid such as hydrochloric acid, nitric acid, or sulfuric acid or an aqueous solution of an organic acid such as acetic acid can be used. The fired product is preferably cleaned with an acidic aqueous solution and then water.

The degree of cleaning is preferably such that a supernatant liquid obtained from the following dispersion is substantially neutral (a pH of about 5 to 9): a dispersion which is prepared by dispersing the cleaned fired product in a tenfold volume of water and then allowed to stand for one hour. If the supernatant liquid is basic or acidic, the fired product may exert adverse effects on a liquid medium or the like described below in the course of mixing the fired product and the liquid medium or the like together.

The degree of cleaning can be defined as the conductivity (hereinafter referred to as "supernatant liquid conductivity" in some cases) of the supernatant liquid, which is obtained from the dispersion which is prepared by dispersing the cleaned fired product in a tenfold volume of water and then allowed to stand for one hour. In view of emission properties, the supernatant liquid conductivity is preferably small. In view of producibility, cleaning is preferably repeated until the supernatant liquid conductivity is usually reduced to 20 mS/m or less, preferably 10 mS/m or less, and more preferably 5 mS/m or less.

The supernatant liquid conductivity may be measured by the following procedure: the fired product is dispersed in a tenfold volume of water by stirring the water for, for example, ten minutes; particles of the fired product that have a density greater than that of the water are precipitated in such a manner that the dispersion is allowed to stand for one hour; the supernatant liquid is taken from the resulting dispersion and then measured for conductivity with the conductivity meter "EC METER CM-30G", available from DKK-TOA Corporation, or the like. Water used for cleaning or the measurement of the conductivity is not particularly limited. Desalted water or distilled water is preferably used therefor. Water used preferably has low conductivity. The conductivity of water used is usually 0.0064 mS/m or more and is usually 1 mS/m or less and preferably 0.5 mS/m or less. The conductivity thereof is usually measured at room temperature (about 25° C.)

Classification can be performed using, for example, a water sieve or a classifier such as a pneumatic classifier or a vibrating sieve. In particular, a dry classifier with a nylon mesh filter is useful in obtaining a phosphor which has a weight-average median diameter of about 10 μm and good dispersibility.

The combination of levigation and dry classification using a nylon mesh filter allows Inorganic Compound (I) to have a weight-average median diameter $D_{50}$ of about 20 μm and good dispersibility.

In water-sieving or levigation, particles of Inorganic Compound (I) are usually dispersed in an aqueous medium such that the dispersion has a concentration of 0.1% to 10% by volume. In order to prevent the degradation of Inorganic Compound (I), the pH of the aqueous medium is usually four or more and preferably five or more and is usually nine or less and preferably eight or less. In order to obtain particles of Inorganic Compound (I) that have the above weight-average median diameter $D_{50}$, classification is preferably performed in two steps in such a manner that, for example, particles with a size of 50 μm or less are obtained and particles with a size of 30 μm or less are then obtained because of a balance between operation efficiency and yield. Treatment is preferably performed such that the following particles are separated: particles which usually have a size of 1 μm or more and preferably 5 μm or more.

In the case where a light-emitting device is manufactured by a method below using Inorganic Compound (I) as a red phosphor, in order to enhance weather resistance such as moisture resistance or in order to enhance the dispersibility of resin in a phosphor-containing portion of the light-emitting device, Inorganic Compound (I) may be surface-treated so as to be coated with a material different therefrom.

Examples of a substance (hereinafter referred to as "surface-treating substance") that may be present on Inorganic Compound (I), which is to be used as a phosphor, include organic compounds, inorganic compounds, and glass materials.

Examples of the organic compounds include fusible polymers such as acrylic resins, polycarbonates, polyamides, and polyethylenes; latexes; and polyorganosiloxanes.

Examples of the inorganic compounds include metal oxides such as magnesium oxide, aluminum oxide, silicon dioxide, titanium oxide, zirconium oxide, tin oxide, germanium oxide, tantalum oxide, niobium oxide, vanadium oxide, boron oxide, antimony oxide, zinc oxide, yttrium oxide, and bismuth oxide; metal nitrides such as silicon nitride and aluminum nitride; orthophosphates such as calcium phosphate, barium phosphate, and strontium phosphate; polyphosphates; and combinations of alkali metal or alkaline-earth metal phosphates and calcium salts, for example, a combination of sodium phosphate and calcium nitrate.

Examples of the glass materials include borosilicates, phosphosilicates, and alkali silicates.

These surface-treating substances may be used alone or in combination at an arbitrary ratio.

A phosphor obtained by surface-treating Inorganic Compound (I) is based on the presence of the surface-treating substance and modes of the phosphor are as described below.

(i) The phosphor is coated with a continuous film made of the surface-treating substance.

(ii) The phosphor is coated with a large number of particles of the surface-treating substance.

The amount of the surface-treating substance adhering to or covering the phosphor is arbitrary as long as advantages of the present invention are not seriously reduced. The amount thereof is usually 0.1% by weight or more, preferably 1% by weight or more, more preferably 5% by weight or more, and further more preferably 10% by weight or more of the weight of Inorganic Compound (I). The amount thereof is usually 50% by weight or less, preferably 30% by weight or less, and more preferably 20% by weight or less of the weight of Inorganic Compound (I). When the amount of the surface-treating substance is extremely large with respect to that of the phosphor, light-emitting properties of the phosphor may be impaired. When the amount thereof is extremely small, the phosphor is incompletely coated with the surface-treating substance and therefore the moisture resistance and/or dispersibility of the phosphor may be insufficiently improved.

The thickness of a film (layer) which is made of the surface-treating substance and which is formed by surface treatment is not particularly limited as long as advantages of the present invention are not seriously reduced. The film thickness is usually 10 nm or more and preferably 50 nm or more and is usually 2000 nm or less and preferably 1000 nm or less. When the film thickness is extremely large, light-emitting properties of the phosphor may be impaired. When the film thickness is extremely small, the phosphor is incompletely coated with the surface-treating substance and therefore the moisture resistance and/or dispersibility of the phosphor may be insufficiently improved.

A process for surface-treating Inorganic Compound (I) is not particularly limited. An example of such a technique is a coating process, described below, using, for example, a metal oxide (silicon dioxide).

The following materials are added to an alcohol such as ethanol in this order while the alcohol is being agitated: Inorganic Compound (I), an alkaline aqueous solution such as ammonia water, and a hydrolyzable alkyl silicate such as tetraethyl orthosilicate. After a solution prepared by the above procedure is allowed to stand for three to 60 minutes, a supernatant liquid containing particles of silicon dioxide separated from Inorganic Compound (I) is removed from the solution with a pipette or the like. The following procedure is repeated several times: the resulting solution is mixed with an alcohol, the mixture is agitated and then allowed to stand, and a supernatant liquid is removed from the resulting mixture. The resulting mixture is dried at 120° C. to 150° C. for ten minutes to five hours, for example, two hours in a vacuum, whereby the surface-treated phosphor is obtained.

Examples of a process for surface-treating the phosphor include the following known processes: processes for attaching, for example, fine spherical particles of silicon dioxide to phosphors (Japanese Unexamined Patent Application Publication Nos. 2-209989 and 2-233794); a process for attaching a film of a silicon compound to a phosphor (Japanese Unexamined Patent Application Publication No. 3-231987); a process for coating fine phosphor particles with fine polymer particles (Japanese Unexamined Patent Application Publication No. 6-314593); a process for coating a phosphor with an organic material, an inorganic material, a glass material, and the like (Japanese Unexamined Patent Application Publication No. 2002-223008); a process for forming a coating on a phosphor by a chemical vapor-phase reaction (Japanese Unexamined Patent Application Publication No. 2005-82788); and a process for attaching particles of a metal compound to a phosphor (Japanese Unexamined Patent Application Publication No. 2006-28458).

[2-7. Production by Alloy Method]

A production method using an alloy as a source material can be used to obtain the inorganic compound represented by Formula (I) in addition to the above raw materials and method.

Examples of a known process, widely used for industrial purposes, for purifying a single metal include sublimation purification processes, floating zone processes, and distillation processes. The single metal can be more readily purified as compared to compounds. There are a large number of elements similar to the single metal. Therefore, the production of the phosphor from a single metal element is superior to the production of the phosphor from a compound because a source material with high purity can be readily obtained.

In view of the uniform dispersion of the activation element in a crystal lattice, the activation element can be uniformly distributed with ease in such a manner that metals that are sources of elements are melted into an alloy.

Therefore, the use of an alloy containing elements of Inorganic Compound (I) as a starting material or the use of an alloy containing all elements of Inorganic Compound (I) as a starting material allows the commercial production of Inorganic Compound (I), which is used to produce the high-performance phosphor. According to the present invention, the Si-to-Al ratio of the source alloy is greater than one and less than 1.14 as described above.

Known examples of a conventional alloy containing Si and an alkaline-earth metal include $Ca_7Si$, $Ca_2Si$, $Ca_5Si_3$, $CaSi$, $Ca_2Si_2$, $Ca_{14}Si_{19}$, $Ca_3Si_4$, $SrSi$, $SrSi_2$, $Sr_4Si_7$, $Sr_5Si_3$, and $Sr_7Si$. Known examples of a conventional alloy containing Si, aluminum, and an alkaline-earth metal include $Ca(Si_{1-x}Al_x)_2$, $Sr(Si_{1-x}Al_x)_2$, $Ba(Si_{1-x}Al_x)_2$, and $Ca_{1-x}Sr_x(Si_{1-y}Al_y)_2$. In particular, $A(B_{0.5}Si_{0.5})_2$: (A=Ca, Sr, Ba; B=Al, Ga) has been investigated for superconductivity as disclosed in Japanese Unexamined Patent Application Publication No. 2005-54182; M. Imai, Applied Physics Letters, 80 (2002) 1019-1021; M. Imai, Physical Review B, 68, (2003), 064512; and the like.

According to the present invention, a known process, such as an arc melting process or an high frequency melting process can be use to melt the Si and alkaline-earth metal-containing alloy.

Since a block of the source alloy is hardly converted into the phosphor, the source alloy is preferably pulverized into particles with a predetermined size in a pulverizing step. The particles usually have a size of 1 to 500 µm. Even if the source alloy has a nonuniform portion, the source alloy is homogenized in the pulverizing step on a macroscopic level. However, it is not preferable that the alloy particles have different compositions on a microscopic level. Therefore, the whole of the source alloy is preferably uniform.

After a crucible or tray carrying the alloy powder prepared as described above is placed into a furnace in which the atmosphere can be controlled, a gas containing nitrogen is fed through the furnace, whereby the air in the system is sufficiently replaced with this gas. After the system is evacuated, this gas may be fed through the system as required. A gas mixture of nitrogen and oxygen can be used to produce an oxynitride.

The alloy powder is preferably fired in such a manner that the volume filling factor thereof is maintained at 40% or less. The volume filling factor thereof can be determined from the expression (the apparent density of the mixed powder)/(the theoretical density of the mixed powder)×100(%). A container carrying the alloy powder is preferably made of a boron nitride sintered body because the boron nitride sintered body is insensitive to metal compounds.

The reaction of a metal with nitrogen is usually exothermic. In the case where a metal alloy is used as a source material, it should be noticed that the reaction between a metal and nitrogen needs to be slowed because the alloy is melted by the heat generated from the reaction therebetween and therefore the surface area of the alloy is reduced. Therefore, in order to stably produce Inorganic Compound (I), which is used to produce the high-performance phosphor, the rate of the reaction therebetween is preferably kept such that the alloy is not melted.

[3. Phosphor-Containing Composition]

The phosphor (hereinafter referred to as "phosphor according to the present invention"), which is described in the item [1. Inorganic Compound (Phosphor)], can be used in combination with liquid mediums. In the case where the phosphor according to the present invention is used for applications such as light-emitting devices, the phosphor according to the present invention is preferably dispersed in the liquid medium. A dispersion prepared by dispersing the phosphor according to the present invention in the liquid medium is hereinafter referred to as "phosphor-containing composition according to the present invention".

[3-1. Phosphor]

The phosphor, which is contained in the phosphor-containing composition according to the present invention, according to the present invention is not particularly limited and may be arbitrarily selected from the examples described above. The phosphor according to the present invention may be used alone or in combination with one or more phosphors at an arbitrary ratio.

The phosphor-containing composition according to the present invention may contain a phosphor other than the phosphor according to the present invention as long as advantages of the present invention are not seriously reduced.

[3-2. Liquid Medium]

The liquid medium, which is used to prepare the phosphor-containing composition according to the present invention, is not particularly limited as long as the performance of the phosphor kept within a desired scope. The liquid medium may be an arbitrary inorganic or organic material which exhibits liquid properties under desired conditions, in which the phosphor can be dispersed, and which causes no adverse reaction.

Examples of the inorganic material include metal alkoxides, solutions prepared by hydrolyzing ceramic precursor polymer- or metal alkoxide-containing solutions by a sol-gel process, and inorganic materials (for example, inorganic materials having a siloxane bond) prepared by solidifying combinations of these materials.

Examples of the organic material include thermoplastic resins, heat-curable resins, and photocurable resins. Particular examples of the organic material include methacrylic resins such as polymethylmethacrylates; styrene resins such as polystyrenes and styrene-acrylonitrile copolymers; polycarbonates; polyesters; phenoxy resins; butyral resins; polyvinyl alcohols; cellulose resins such as ethyl cellulose, cellulose acetate, and cellulose acetate butyrate; epoxy resins; phenol resins; and silicone resins.

In the case where the phosphor is used for high-power light-emitting devices such as lighting systems, a silicon-containing compound is preferably used in view of heat resistance and light resistance.

The silicon-containing compound is defined as a compound containing silicon. Examples of the silicon-containing compound include organic compounds (silicone materials) such as polyorganosiloxanes; inorganic compounds such as silicon dioxide, silicon nitride, and silicon oxynitride; and glass materials such as borosilicates, phosphosilicates, and alkali silicates. In particular, the silicone materials are preferable because they are easy to handle.

The silicone materials are usually defined as organic polymers having siloxane bonds. Examples of the silicone materials include compounds represented by the following formula and/or mixtures thereof:

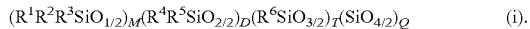

$(R^1R^2R^3SiO_{1/2})_M(R^4R^5SiO_{2/2})_D(R^6SiO_{3/2})_T(SiO_{4/2})_Q$ (i).

In Formula (i), $R^1$ to $R^6$ each independently represent one selected from the group consisting of an organic functional group, a hydroxyl group, and a hydrogen atom and may be the same or different from each other.

In Formula (i), M, D, T, and Q are numbers which are greater than zero and less than one and which satisfy the equation M+D+T+Q=1.

For the purpose of sealing semiconductor devices, the silicone materials can be used in such a manner that the silicone materials in the form of liquid are applied to the semiconductor devices and then cured with heat or light.

The silicone materials can be categorized into a polyaddition-curable type, a polycondensation-curable type, an ultraviolet-curable type, and a peroxide-crosslinking type on the basis of their curing mechanism. In particular, the polyaddition-curable type (a polyaddition silicone resin), the polycondensation-curable type (a polycondensation silicone resin), the ultraviolet-curable type are preferable. A polyaddition silicone material and a polycondensation silicone material are described below.

The polyaddition silicone material is defined as a material having polyorganosiloxane chains crosslinked by polyaddition. Typical examples of the polyaddition silicone material include compounds which are produced by the reaction of, for example, vinylsilane with hydrosilane in the presence of a Pt catalyst and which have Si—C—C—Si crosslinks and similar compounds. These compounds are commercially available. Examples of these compounds include the products LPS-1400, LPS-2410, and LPS-3400 which are available from Shin-Etsu Chemical Co., Ltd. And which are polyaddition-curable.

The polycondensation silicone material is defined as a compound which is produced by the hydrolysis/polycondensation of, for example, an alkylalkoxysilane and which has Si—O—Si crosslinks.

Examples of the polycondensation silicone material include compounds represented by Formula (ii) or (iii) below and polycondensation products obtained by the hydrolysis/polycondensation of oligomers thereof. These compounds and the oligomers may be used alone or in combination at an arbitrary ratio.

$M^{m+}Z_nY^1_{m-n}$ (ii)

(in Formula (ii), M represents at least one selected from the group consisting of silicon, aluminum, zirconium, and titanium; Z represents a hydrolyzable group, $Y^1$ represents a monovalent organic group; m represents the valence of M and is an integer not less than one; n represents the valence of Z and is an integer not less than one; and m≧n.)

$(M^{s+}Z_tY^1_{s-t-1})_uY^2$ (iii)

(in Formula (iii), M represents at least one selected from the group consisting of silicon, aluminum, zirconium, and titanium; Z represents a hydrolyzable group, $Y^1$ represents a monovalent organic group; $Y^2$ represents an organic group with a valence represented by u; s represents the valence of M and is an integer not less than one; t is an integer of one to s-1; and u is an integer not less than two.)

The polycondensation silicone material may contain a curing agent. A preferable example of the curing agent is a metal chelate. The metal chelate preferably contains one or more of Ti, Ta, and Zr and more preferably Zr. The curing agent may be used alone or in combination with another curing agent at an arbitrary ratio.

Preferable examples of the polycondensation silicone material include materials for semiconductor devices disclosed in Japanese Unexamined Patent Application Publication Nos. 2007-112973 to 2007-112975, 2007-19459, and 2006-176468.

Particularly preferable examples of the polycondensation silicone material are described below.

There is a problem in that ordinary silicone materials have low adhesion to semiconductor light-emitting devices, substrate for forming devices, and packages. Preferable examples of a silicone material having high adhesion include polycondensation silicone materials having at least one of Features [5] to [7] below.

[5] The content of silicon is 20% by weight or more.
[6] At least one peak originating from Si specified in Item (a) or (b) is present in a solid-state Si-nuclear magnetic resonance (NMR) spectrum obtained by a technique described below in detail.
  (a) A peak that is centered at a chemical shift of −40 to 0 ppm relative to a tetramethoxysilane standard and has a full width at half maximum of 0.3 to 3.0 ppm.
  (b) A peak that is centered at a chemical shift of −80 to less than −40 ppm relative to a tetramethoxysilane standard and has a full width at half maximum of 0.3 to 5.0 ppm.
[7] The content of a silanol is 0.1% to 10% by weight.

A silicone material used herein preferably has Feature [5], more preferably Features [5] and [6], and further more preferably Features [5] to [7]. Features [5] to [7] are described below in detail.

[3-2-1. Feature [5] (Silicon Content)]

A silicone material preferably used herein usually has a silicon content of 20% by weight or more, preferably 25% by weight or more, and more preferably 30% by weight or more. The upper limit of the silicon content thereof is usually 47% by weight or less, because a glass material consisting of $SiO_2$ has a silicon content of 47% by weight.

The silicon content of the silicone material can be determined from results obtained by analyzing the silicone material by inductively coupled plasma spectroscopy (hereinafter simply referred to as "ICP") in a manner below.
{Determination of Silicon Content}

The silicone material is placed into a platinum crucible and then fired at 450° C. for one hour, at 750° C. for one hour, and then at 950° C. for 1.5 hours in air, whereby carbon was removed. The residue obtained as described above is mixed with a tenfold or more volume of sodium carbonate. The mixture is heated with a burner, cooled, and then mixed with desalted water. This mixture is neutralized with hydrochloric acid. The volume of this mixture is adjusted such that the silicon content of this mixture is several ppm. This mixture is then analyzed by ICP.

[3-2-2. Feature [6] (Solid-State Si-NMR Spectrum)]

The measurement of the solid-state Si-NMR spectrum of the silicone material, which is preferably used herein, preferably shows one or more peaks which originate from silicon atoms directly bonded to carbon atoms contained in organic groups and which are located in regions specified in Item (a) and/or (b).

The silicone material, which is preferably used herein, has a peak located in the chemical shift range specified in Item (a). The full width at half maximum of this peak is usually 3.0 ppm or less and preferably 2.0 ppm or less and is usually 0.3 ppm or more. The full width at half maximum of this peak is less than that of the peak specified in Item (b) because the restriction of molecular motion is low.

The silicone material also has a peak located in the chemical shift range specified in Item (b). The full width at half maximum of this peak is usually 5.0 ppm or less and preferably 4.0 ppm or less and is usually 0.4 ppm or more and preferably 0.4 ppm or more.

When the full widths at half maximum of the peaks located in the above chemical shift ranges are large, the restriction of molecular motion is high and a large strain is caused; hence, members which are readily cracked and have low heat resistance and weather resistance may be formed. In the case where the silicone material contain a large amount of a tetrafunctional silane or the silicone material is rapidly dried in a drying step and therefore has a large internal stress, the full widths at half maximum of the peaks are greater than the above ranges.

When the full widths at half maximum of the peaks are extremely small, Si atoms under such conditions are not involved in siloxane crosslinking, that is, uncrosslinked trifunctional silanes remain; hence, members having heat or weather resistance lower than that of a material having siloxane bonds may be formed.

Although silicone materials containing a large amount of an organic component and a small amount of a Si component may have peaks which are centered at a chemical shift of −80 ppm or more and which have full widths at half maximum within the above range, the silicone materials may have low heat resistance, weather resistance, and coating properties.

The chemical shift of the silicone material, which is preferably used herein, can be calculated from results obtained by subjecting the silicone material to solid-state Si-NMR analysis in, for example, a manner below. The analysis of the obtained measurement data (the analysis of the full width at half maximum of peaks and the content of a silanol) is performed in such a manner that peaks are separately extracted by curve-fitting analysis or the like using a Gaussian function or a Lorentzian function.
{Determination of Solid-State Si-NMR Spectrum and Calculation of Silanol Content}

The solid-state Si-NMR spectrum of the silicone material is measured under conditions below and the obtained data is subjected to waveform separation analysis. The full width at half maximum of each peak of the silicone material is determined from the obtained waveform data. The ratio (%) of silicon atoms of silanol groups to all silicon atoms in the silicone material is determined from the ratio of the area of peaks originating from the silanol groups to the area of all peaks and then compared to the silicon content determined in another way, whereby the silanol content is determined.
{System Conditions}
  System: Infinity CMX-400 nuclear magnetic resonance spectrometer available from Chemagnetics
  $^{29}Si$ resonant frequency: 79.436 MHz
  Probe: 7.5 mm φ CP/MAS probe
  Measurement temperature: room temperature
  Rotation speed of sample: 4 kHz
  Measurement technique: single pulse technique
  $^1H$ decoupling frequency: 50 kHz
  $^{29}Si$ flip angle: 90°
  $^{29}Si$ 90° pulse width: 5.0 μs
  Repetition time: 600 s
  Number of scans: 128
  Bandwidth: 30 kHz
  Broadening factor: 20 Hz
  Reference sample: tetramethoxysilane For the silicone material, 512 points are measured and the obtained data is processed into 8192 points by zerofilling and then Fourier-transformed.

{Curve-Fitting Analysis}

Each peak of a Fourier transformed spectrum is optimized by a nonlinear least square procedure using variable parameters such as the center position, height, and full width at half maximum of a peak shape created by Lorentzian and Gaussian line shapes or mixed Lorentzian-Gaussian line shapes.

The peak is identified with respect to AIChE Journal, 44(5), p. 1141, 1998 or the like.

[3-2-3. Feature [7] (Silanol Content)]

The silicone material, which is preferably used herein, usually has a silanol content of 0.1% by weight or more and preferably 0.3% by weight or more. The silanol content thereof is usually 10% by weight or less, preferably 8% by weight or less, and more preferably 5% by weight or less. When the silanol content of the silicone material is low, the silicone material hardly changes with time and has good properties such as high long-term stability, low hygroscopicity, and low moisture permeability. When the silicone material contains no silanol, the silicone material has low adhesion; hence, the silanol content thereof is as specified above.

The silanol content of the silicone material can be determined as described below: the silicone material is analyzed by solid-state Si-NMR spectroscopy by the procedure described in the sub-item {Determination of solid-state Si-NMR spectrum and calculation of silanol content} of the item [2-2-2. Feature [6] (solid-state Si-NMR spectrum)] and the ratio (%) of silicon atoms of silanol groups to all silicon atoms in the silicone material is determined from the ratio of the area of peaks originating from the silanol groups to the area of all peaks and then compared to the silicon content determined in another way.

The silicone material, which is preferably used herein, contains an appropriate amount of a silanol; hence, molecules of the silanol are hydrogen-bonded to polar sites on devices, thereby creating adhesion. Examples of the polar sites include hydroxyl groups and oxygen atoms in metaloxane bonds.

If the silicone material is heated in the presence of an appropriate catalyst, the silanol molecules are covalently bonded to hydroxy groups on devices by dehydrocondensation, thereby creating high adhesion.

When the silanol content is extremely large, the following problem may arise: it is difficult to use the silicone material for coating applications because of an increase in the viscosity thereof, cracks are caused by bubbling and/or an increase in internal stress because the silicone material has high activity and therefore is solidified in advance of the vaporization of heated low-boiling point components, and the like.

[3-2-4. Content of Liquid Medium]

The content of the liquid medium in the phosphor-containing composition according to the present invention is arbitrary as long as advantages of the present invention are not seriously reduced. The content of the liquid medium in the phosphor-containing composition according to the present invention is usually 50% by weight or more and preferably 75% by weight or more and is usually 99% by weight or less and preferably 95% by weight or less. The content of the phosphor in the phosphor-containing composition according to the present invention is usually 1% by weight or more and preferably 5% by weight or more and is usually 50% by weight or less and preferably 25% by weight or less. If the content of the liquid medium therein is extremely large, no problem may arise. In the case where the phosphor-containing composition is used to manufacture semiconductor light-emitting devices having desired color coordinates, color rendering indexes, and light emission efficiency, the content of the liquid medium is preferably as described above. When the content of the liquid medium is extremely small, the phosphor-containing composition has low fluidity and may be difficult to handle.

In the phosphor-containing composition according to the present invention, the liquid medium principally functions as a binder. The liquid medium may be used alone or in combination with another liquid medium at an arbitrary ratio. When the liquid medium contains, for example, a silicon-containing compound for the purpose of achieving high heat resistance and light resistance, the liquid medium may contain such an amount of a heat-curable resin, such as an epoxy resin, that the durability of the silicon-containing compound is not impaired. The amount of the heat-curable resin in the liquid medium, which functions as such a binder, is usually 25% by weight or less and preferably 10% by weight or less.

[3-3. Other Components]

The phosphor-containing composition according to the present invention may contain other components in addition to the phosphor and the liquid medium as long as advantages of the present invention are not seriously reduced. The phosphor-containing composition according to the present invention may contain, for example, a metal oxide, having a high refractive index, for refractive index adjustment and a known additive such as a diffusing agent, a filler, a viscosity modifier, or an ultraviolet absorber.

These materials may be used alone or in combination at an arbitrary ratio.

[3-4. Advantage of Phosphor-Containing Composition]

For the phosphor-containing composition according to the present invention, the phosphor according to the present invention can be fixed at a desired position. In the case where the phosphor-containing composition according to the present invention is used to manufacture a light-emitting apparatus, the phosphor according to the present invention can be sealed with the liquid medium and fixed at a desired position in such a manner that the phosphor-containing composition according to the present invention is placed at the desired position and the liquid medium is then subjected to curing.

[4. Light-Emitting Device]

A light-emitting device according to the present invention includes a first illuminator and a second illuminator that emits visible light when the second illuminator is irradiated with the light emitted from the first illuminator. The second illuminator contains at least one first phosphor including the phosphor according to the present invention.

The light-emitting device according to the present invention may have any known configuration as long as the light-emitting device according to the present invention includes the first illuminator and the second illuminator, which contains at least one first phosphor including the phosphor according to the present invention.

The light-emitting device may have a configuration below.

[4-1. Configuration of Light-Emitting Device (First Illuminator)]

The first illuminator emits light for exciting the second illuminator, which is described below in detail.

The wavelength of the light emitted from the first illuminator overlaps with that of the light absorbed by the second illuminator and is not particularly limited. The first illuminator may emit light with a wide wavelength. The first illuminator usually emits light with wavelengths ranging from ultraviolet to blue and preferably emits light with wavelengths ranging from near-ultraviolet to blue. In particular, the wavelength of the light emitted from the first illuminator is usually 200 nm or more. In the case where the second illuminator is excited with near-ultraviolet light, the peak wavelength of the light emitted from the first illuminator is usually 300 nm or more, preferably 330 nm or more, and more preferably 360 nm or more and is usually 420 nm or less. In the case where the second illuminator is excited with blue light, the peak wavelength of the light emitted from the first illuminator is usually 420 nm or more and preferably 430 nm or more and is usually 500 nm or less and preferably 480 nm or less. This is due to the color purity of the light-emitting device. The first illuminator is usually a semiconductor light-emitting device. Examples of the first illuminator include light-emitting diodes (LEDs) and semiconductor laser diodes (hereinafter simply referred to as "LDs"). Other examples of the first illuminator include organic electroluminescent devices and inorganic electroluminescent devices. Examples of the first illuminator are not limited to those described herein.

The first illuminator is preferably a GaN-based LED or LD containing a GaN compound semiconductor. This is because the GaN-based LED or LD has far higher emission intensity and external quantum efficiency as compared to SiC-based LEDs emitting light with the above wavelength and therefore a combination of the phosphor and GaN-based LED or LD effective in emitting bright light at low power consumption. The GaN-based LED or LD has an emission intensity that is at least 100 times greater than that of the SiC-based LEDs when the currents applied thereto are 20 mA. The GaN-based LED or LD preferably includes an $Al_xGa_yN$ light-emitting layer, a GaN light-emitting layer, or an $In_xGa_yN$ light-emitting layer. In particular, the $In_xGa_yN$ light-emitting layer is preferable because the emission intensity thereof is very high. The GaN-based LED particularly preferably has a multi-quantum well structure including an $In_xGa_yN$ layer and a GaN layer because very high emission intensity can be achieved.

In the above chemical formulas, the expression X+Y usually has a value of 0.8 to 1.2. For the GaN-based LED, the above light-emitting layer preferably doped with Zn or Si or contains no dopant in view of the control of light-emitting properties.

The GaN-based LED includes the light-emitting layer, a p-layer, an n-layer, electrodes, and a substrate, which are principal components thereof. The GaN-based LED preferably has a hetero-structure in which the light-emitting layer is sandwiched between a p- or n-type $Al_xGa_yN$ layer and a GaN layer or an $In_xGa_yN$ layer, because high light emission efficiency can be achieved. The GaN-based LED more preferably has the multi-quantum well structure instead of the hetero-structure, because high light emission efficiency can be achieved.

The first illuminator may be used alone or in combination with another illuminator at an arbitrary ratio.

[4-2. Configuration of Light-Emitting Device (Second Illuminator)]

The second illuminator, which is included in the light-emitting device according to the present invention, emits visible light when the second illuminator is irradiated with the light emitted from the first illuminator as described above. The second illuminator contains the first phosphor (usually a red phosphor), which the phosphor according to the present invention, and may further contain a second phosphor (green, blue, or yellow phosphor) below as required. The second illuminator is prepared in such a manner that the first and second phosphors are dispersed in, for example, a sealing material.

The composition of a phosphor, other than the phosphor according to the present invention, contained in the second phosphor is not particularly limited. Examples of such a phosphor include combinations of host crystals such as metal oxides represented by $Y_2O_3$, $YVO_4$, $Zn_2SiO_4$, $Y_3Al_5O_{12}$, $Sr_2SiO_4$, and the like; metal nitrides represented by $Sr_2Si_5N_8$ and the like; phosphates represented by $Ca_5(PO_4)_3Cl$ and the like; sulfides represented by ZnS, SrS, CaS, and the like; oxyphosphides represented by $Y_2O_2S$, $La_2O_2S$, and the like; and ions of activation or co-activation elements that are alkaline-earth metals such as Ce, Pr, Nd, Pm, Sm, Eu, Tb, Dy, Ho, Er, Tm, and Yb and metals such as Ag, Cu, Au, Al, Mn, and Sb.

Preferable examples of the host crystals include sulfides such as (Zn, Cd)S, $SrGa_2S_4$, SrS, and ZnS; oxysulfides such as $Y_2O_2S$; aluminates such as (Y, $Gd)_3Al_5O_{12}$, $YAlO_3$, $BaMgAl_{10}O_{17}$, (Ba, Sr) (Mg, $Mn)Al_{10}O_{17}$, (Ba, Sr, Ca) (Mg, Zn, $Mn)Al_{10}O_{17}$, $BaAl_{12}O_{19}$, $CeMgAl_{11}O_{19}$, (Ba, Sr, Mg)O·$Al_2O_3$, $BaAl_2Si_2O_8$, $SrAl_2O_4$, $Sr_4Al_{14}O_{25}$, and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and (Y, $Gd)BO_3$; halophosphates such as $Ca_{10}(PO_4)_6(F, Cl)_2$ and (Sr, Ca, Ba, $Mg)_{10}(PO_4)_6Cl_2$; and phosphates such as $Sr_2P_2O_7$ and (La, $Ce)PO_4$.

The host crystals and the activation or co-activation elements are not particularly limited and may be replaced with a related element. Any phosphors obtained from the host crystals and the activation or co-activation elements can be used.

In particular, phosphors listed below can be used. These phosphors are for illustrative purposes only. The present invention is not limited to these phosphors. In descriptions below, phosphors partially different in structure from each other are shown in an abbreviated manner.

[4-2-1. First Phosphor]

The second illuminator, which is included in the light-emitting device according to the present invention, includes the first phosphor, which is the phosphor according to the present invention. The phosphor according to the present invention may be used alone or in combination with another phosphor at an arbitrary ratio.

The first phosphor may be a phosphor (similar-color concomitant phosphor), other than the phosphor according to the present invention, emitting fluorescent light of which the color is substantially the same as that of the light emitted from the phosphor according to the present invention. Since the phosphor according to the present invention usually emits red fluorescent light, the first phosphor may be a mixture of the phosphor according to the present invention and an orange or red phosphor.

(Orange or Red Phosphor)

In the case where the orange or red phosphor is used, any type of orange or red phosphor can be used as long as advantages of the present invention are not seriously reduced. The emission peak wavelength of the orange or red phosphor is usually 570 nm or more, preferably 580 nm or more, and more preferably 585 nm or more and is usually 780 nm or less, preferably 700 nm or less, and more preferably 680 nm or less.

The full width at half maximum of the emission peak wavelength of the orange or red phosphor usually is within a range from 1 to 100 nm.

The external quantum efficiency of the orange or red phosphor is usually 60% or more and preferably 70% or more. The weight-average median diameter thereof is usually 1 µm or more, preferably 5 Km or more, and more preferably 10 µm or more and is usually 30 µm or less, preferably 20 µm or less, and more preferably 15 µm or less.

Examples of the orange or red phosphor include europium-activated alkaline-earth silicon nitride phosphors represented by the formula (Mg, Ca, Sr, $Ba)_2Si_5N_8$:Eu and europium-activated alkaline-earth oxychalcogenide phosphors represented by the formula (Y, La, Gd, $Lu)_2O_2S$:Eu. The europium-activated alkaline-earth silicon nitride phosphors have broken grains with red fracture surfaces and emit red light. The europium-activated alkaline-earth oxychalcogenide phosphors have regular crystal grains with substantially a spherical shape and emit red light.

The following phosphors can be used herein: phosphors which are disclosed in Japanese Unexamined Patent Application Publication No. 2004-300247 and which contain an oxynitride and/or oxysulfide containing at least one selected from the group consisting of Ti, Zr, Hf, Nb, Ta, W, and Mo and also contain an oxynitride having an alpha-sialon structure in which all or some of Al atoms are replaced with Ga atoms. These phosphors contain an oxynitride and/or an oxysulfide.

Other examples of the orange or red phosphor include Eu-activated oxysulfide phosphors such as (La, $Y)_2O_2S$:Eu; Eu-activated oxide phosphors such as Y(V, $P)O_4$:Eu and $Y_2O_3$:Eu; Eu- and/or Mn-activated silicate phosphors such as (Ba, $Mg)_2SiO_4$:Eu and (Ba, Sr, Ca, $Mg)_2SiO_4$:Eu,Mn; Eu-activated tungstate phosphors such as $LiW_2O_8$:Eu, $LiW_2O_8$:Eu,Sm, $Eu_2W_2O_9$, $Eu_2W_2O_9$:Nb, and $Eu_2W_2O_9$:Sm; Eu-activated sulfide phosphors such as (Ca, Sr)S:Eu; Eu-activated aluminate phosphors such as $YAlO_3$:Eu; Eu-activated silicate phosphors such as $Ca_2Y_8(SiO_4)_6O_2$:Eu, $LiY_9(SiO_4)_6O_2$:Eu, (Sr, Ba, Ca)$_3SiO_5$: Eu, and $Sr_2BaSiO_5$:Eu; Ce-activated aluminate phosphors such as (Y, Gd)$_3Al_5O_{12}$:Ce and (Tb, Gd)$_3Al_5O_{12}$:Ce; Eu-activated oxide, nitride, or oxynitride phosphors such as (Mg, Ca, Sr, Ba)$_2Si_5(N, O)_8$:Eu, (Mg, Ca, Sr, Ba)Si(N, O)$_2$:Eu, and (Mg, Ca, Sr, Ba)AlSi(N, O)$_3$:Eu; Ce-activated oxide, nitride, or oxynitride phosphors such as (Mg, Ca, Sr, Ba)AlSi(N, O)$_3$:Ce; Eu- and/or Mn-activated halophosphate phosphors such as (Sr, Ca, Ba, Mg)$_{10}$(PO$_4$)$_6$Cl$_2$:Eu,Mn; Eu- and/or Mn-activated silicate phosphors such as $Ba_3MgSi_2O_8$:Eu,Mn and (Ba, Sr, Ca, Mg)$_3$(Zn, Mg)Si$_2O_8$:Eu,Mn; Mn-activated germanate phosphors such as 3.5MgO.0.5MgF$_2$.GeO$_2$:Mn; Eu-activated oxynitride phosphors such as Eu-activated α-sialons; Eu- and/or Bi-activated oxide phosphors such as (Gd, Y, Lu, La)$_2O_3$:Eu,Bi; Eu- and/or Bi-activated oxysulfide phosphors such as (Gd, Y, Lu, La)$_2O_2$S:Eu,Bi; Eu- and/or Bi-activated vanadate phosphors such as (Gd, Y, Lu, La)VO$_4$:Eu,Bi; Eu- and/or Ce-activated sulfide phosphors such as $SrY_2S_4$:Eu,Ce; Ce-activated sulfide phosphors such as $CaLa_2S_4$:Ce; Eu- and/or Mn-activated phosphate phosphors such as (Ba, Sr, Ca)MgP$_2O_7$:Eu,Mn and (Sr, Ca, Ba, Mg, Zn)$_2P_2O_7$:Eu,Mn; Eu- and/or Mo-activated tungstate phosphors such as (Y, Lu)$_2WO_6$:Eu,Mo; Eu- and/or Ce-activated nitride phosphors such as (Ba, Sr, Ca)$_x$Si$_y$N$_z$:Eu,Ce, where x, y, and z each represent an integer of one or more; Eu- and/or Mn-activated halophosphate phosphors such as (Ca, Sr, Ba, Mg)$_{10}$(PO$_4$)$_6$(F, Cl, Br, OH):Eu,Mn; and 24 Ce-activated silicate phosphors such as ((Y, Lu, Gd, Tb)$_{1-x-y}$Sc$_x$Ce$_y$)$_2$(Ca, Mg)$_{1-r}$(Mg, Zn)$_{2+r}$Si$_{z-q}$Ge$_q$O$_{12+δ}$.

Examples of the red phosphor include red organic phosphors containing a rare-earth ion complex with a ligand that is an anion of β-diketonate, β-diketone, an aromatic carboxylic acid, or a Brönsted acid; perylene pigments (for example, dibenzo{[f,f']-4,4',7,7'-tetraphenyl}diindeno[1,2,3-cd:1',2',3'-lm] perylene); anthraquinone pigments; lake pigments; azo pigments; quinacridone pigments; anthracene pigments; isoindoline pigments; isoindolinone pigments; phthalocyanine pigments; triphenylmethane-based basic dyes; indanthrone pigments; indophenol pigments; cyanine pigments; and dioxadine pigments.

The red phosphor preferably contains (Ca, Sr, Ba)$_2Si_5(N, O)_8$:Eu, (Ca, Sr, Ba)Si(N, O)$_2$:Eu, (Ca, Sr, Ba)AlSi(N, O)$_3$:Eu, (Sr, Ba)$_3SiO_5$:Eu, (Ca, Sr)S:Eu, (La, Y)$_2O_2$S:Eu, or an Eu complex; more preferably (Ca, Sr, Ba)$_2Si_5(N, O)_8$:Eu, (Ca, Sr, Ba)Si(N, O)$_2$:Eu, (Ca, Sr, Ba)AlSi(N, O)$_3$:Eu, (Sr, Ba)$_3SiO_5$:Eu, (Ca, Sr)S:Eu, (La, Y)$_2O_2$S:Eu, a β-diketone-based Eu complex such as an Eu(dibenzoylmethane)$_3$.1,10-phenanthroline complex, or a carboxylic acid-based Eu complex; and particularly preferably (Ca, Sr, Ba)$_2Si_5(N, O)_8$:Eu, (Ca, Sr, Ba)AlSi(N, O)$_3$:Eu, or (La, Y)$_2O_2$S:Eu.

The orange phosphor is preferably (Sr, Ba)$_3SiO_5$:Eu or (Ca, Sr, Ba)AlSi(N, O)$_3$:Eu.

The orange or red phosphor may be used alone or in combination with another orange or red phosphor at an arbitrary ratio.

[4-2-2. Second Phosphor]

The second illuminator, which is included in the light-emitting device according to the present invention, may contain a phosphor (that is, the second phosphor) in addition to the first phosphor. The second phosphor emits light with a wavelength different from that of the light emitted from the first phosphor. Since the second phosphor is used to control the color tone of the light emitted from the second phosphor, the color of the fluorescent light emitted from the second phosphor is usually different from that of the fluorescent light emitted from the first phosphor. Since the red phosphor is used as the first phosphor, the second phosphor is a green, blue, or yellow phosphor other than the red phosphor.

The weight-average median diameter $D_{50}$ of the second phosphor, which is contained in the light-emitting device according to the present invention, is usually 1 μm or more, preferably 5 μm or more, and more preferably 10 μm or more and is usually 30 μm or less, preferably 25 μm or less, and more preferably 20 μm or less. When the weight-average median diameter $D_{50}$ of the second phosphor is extremely small, the brightness thereof is likely to low and particles of the phosphor tend to aggregate. When the weight-average median diameter $D_{50}$ thereof is extremely large, nonuniform coatings may be formed or dispensers or the like may be clogged.

(Green Phosphor)

In the case where the green phosphor is used as the second phosphor, any type of green phosphor can be used as long as advantages of the present invention are not seriously reduced. The emission peak wavelength of the green phosphor is usually 500 nm or more, preferably 510 nm or more, and more preferably 515 nm or more and usually 550 nm or less, preferably 540 nm or less, and more preferably 535 nm or less. When the emission peak wavelength of the green phosphor is extremely short, the light emitted from the green phosphor tends to have a blue tinge. When the emission peak wavelength thereof is extremely long, the light emitted therefrom tends to have a yellow tinge. That is, both cases can impair properties of the light emitted from the green phosphor.

The green phosphor usually has an emission peak with a full width at half maximum of 40 to 80 nm. The green phosphor usually has an external quantum efficiency of 60% or more and preferably 70% or more.

Examples of the green phosphor include europium-activated alkaline-earth silicon oxynitride phosphors represented by the formula (Mg, Ca, Sr, Ba)Si$_2O_2N_2$:Eu. The europium-activated alkaline-earth silicon oxynitride phosphors have broken grains with fracture surfaces and emit green light.

Other examples of the green phosphor include Eu-activated aluminate phosphors such as $Sr_4Al_{14}O_{25}$:Eu and (Ba, Sr, Ca)Al$_2O_4$:Eu; Eu-activated silicate phosphors such as (Sr, Ba)Al$_2Si_2O_8$:Eu, (Ba, Mg)$_2SiO_4$:Eu, (Ba, Sr, Ca, Mg)$_2SiO_4$:Eu, (Ba, Sr, Ca)$_2$(Mg, Zn)Si$_2O_7$:Eu, and (Ba, Ca, Sr, Mg)$_9$(Sc, Y, Lu, Gd)$_2$(Si, Ge)$_6O_{24}$:Eu; Ce- and/or Tb-activated silicate phosphors such as $Y_2SiO_5$:Ce,Tb; Eu-activated borophosphate phosphors such as $Sr_2P_2O_7$—$Sr_2B_2O_5$—: Eu; Eu-activated halosilicate phosphors such as $Sr_2Si_3O_8$-2SrCl$_2$:Eu; Mn-activated silicate phosphors such as $Zn_2SiO_4$:Mn; Tb-activated aluminate phosphors such as CeMgAl$_{11}O_{19}$:Tb and $Y_3Al_5O_{12}$:Tb; Tb-activated silicate phosphors such as $Ca_2Y_8(SiO_4)_6O_2$:Tb and $La_3Ga_5SiO_{14}$:Tb; Eu-, Tb-, and/or Sm-activated thiogallate phosphors such as (Sr, Ba, Ca)Ga$_2S_4$:Eu,Tb,Sm; Ce-activated aluminate phosphors such as $Y_3$(Al, Ga)$_5O_{12}$:Ce and (Y, Ga, Tb, La, Sm, Pr, Lu)$_3$(Al, Ga)$_5O_{12}$:Ce; Ce-activated silicate phosphors such as $Ca_3Sc_2Si_3O_{12}$:Ce and Ca$_3$(Sc, Mg, Na, Li)$_2Si_3O_{12}$:Ce; Ce-activated oxide phosphors such as $CaSc_2O_4$:Ce; Eu-activated oxynitride phosphors such as Eu-activated β-sialons; Eu- and/or Mn-activated aluminate phosphors such as $BaMgAl_{10}O_{17}$:Eu,Mn; Eu-activated aluminate phosphors such as $SrAl_2O_4$:Eu; Tb-activated oxysulfide phosphors such as (La, Gd, Y)$_2O_2$S:Tb; Ce- and/or Tb-activated phosphate phosphors such as LaPO$_4$:Ce,Tb; sulfide phosphors such as ZnS:Cu,Al and ZnS:Cu,Au,Al; Ce- and/or Tb-activated borate phosphors such as (Y, Ga, Lu, Sc, La)BO$_3$:Ce,Tb, Na$_2$Gd$_2$B$_2$O$_7$:Ce,Tb, and (Ba, Sr)$_2$(Ca, Mg, Zn) B$_2$O$_6$: K, Ce, Tb; Eu- and/or Mn-activated halosilicate phosphors such as Ca$_8$Mg(SiO$_4$)$_4$Cl$_2$:Eu,Mn; Eu-activated thioaluminate and thiogallate phosphors such as (Sr, Ca, Ba)(Al, Ga, In)$_2S_4$:Eu; Eu- and/or Mn-activated halosilicate phosphors such as (Ca, Sr)$_8$(Mg, Zn) (SiO$_4$)$_4$Cl$_2$:Eu, Mn; and Eu-activated oxynitride phosphors such as $M_3Si_6O_9N_4$:Eu and $M_3Si_6O_{12}N_2$:Eu, where M represents an alkaline-earth metal element.

Other examples of the green phosphor include derivatives of pyridine-phthalmide condensates; fluorescent dyes such as benzoxazinone dyes, quinazolinone dyes, coumarin dyes, quinophthalone dyes, and naphthalimide dyes; and organic phosphors such as terbium complexes.

The green phosphor may be used alone or in combination with another phosphor at an arbitrary ratio.

(Blue Phosphor)

In the case where the blue phosphor is used as the second phosphor, any type of blue phosphor can be used as long as advantages of the present invention are not seriously reduced. The emission peak wavelength of the blue phosphor is usually 420 nm or more, preferably 430 nm or more, and more preferably 440 nm or more. The emission peak wavelength thereof is usually 490 nm or less, preferably 480 nm or less, more preferably 470 nm or less, and further more preferably 460 nm or less.

The blue phosphor usually has an emission peak with a full width at half maximum of 20 to 80 nm. The blue phosphor usually has an external quantum efficiency of 60% or more and preferably 70% or more.

Examples of the blue phosphor include europium-activated barium magnesium aluminate phosphors represented by the formula (Ba, Sr, Ca)MgAl$_{10}$O$_{17}$:Eu, europium-activated calcium halophosphate phosphors represented by the formula (Mg, Ca, Sr, Ba)$_5$(PO$_4$)$_3$(Cl, F):Eu, europium-activated alkali-earth chloroborate phosphors represented by the formula (Ca, Sr, Ba)$_2$B$_5$O$_9$Cl:Eu, and europium-activated alkali-earth aluminate phosphors represented by the formula (Sr, Ca, Ba)Al$_2$O$_4$:Eu or (Sr, Ca, Ba)$_4$Al$_{14}$O$_{25}$:Eu. The europium-activated barium magnesium aluminate phosphors have regular crystal grains with substantially a hexagonal shape and emit blue light. The europium-activated calcium halophosphate phosphors have regular crystal grains with substantially a spherical shape and emit blue light. The europium-activated alkali-earth chloroborate phosphors have regular crystal grains with substantially a cubic shape and emit blue light. The europium-activated alkali-earth aluminate phosphors broken grains with fracture surfaces and emit blue light.

Examples of the blue phosphor include Sn-activated phosphate phosphors such as Sr$_2$P$_2$O$_7$:Sn; Eu-activated aluminate phosphors such as (Sr, Ca, Ba)Al$_2$O$_4$:Eu, (Sr, Ca, Ba)$_4$Al$_{14}$O$_{25}$:Eu, BaMgAl$_{10}$O$_{17}$:Eu, (Ba, Sr, Ca)MgAl$_{10}$O$_{17}$:Eu, BaMgAl$_{10}$O$_{17}$:Eu,Tb,Sm, and BaAi$_5$O$_{13}$:Eu; Ce-activated thiogallate phosphors such as SrGa$_2$S$_4$:Ce and CaGa$_2$S$_4$:Ce; Eu- and/or Mn-activated aluminate phosphors such as (Ba, Sr, Ca)MgAl$_{10}$O$_{17}$:Eu,Mn; Eu-activated halophosphate phosphors such as (Sr, Ca, Ba, Mg)$_{10}$(PO$_4$)$_5$Cl$_2$:Eu and (Ba, Sr, Ca)$_5$(PO$_4$)$_3$(Cl, F, Br, OH):Eu,Mn, Sb; Eu-activated silicate phosphors such as BaAl$_2$Si$_2$O$_5$:Eu and (Sr, Ba)$_3$MgSi$_2$O$_8$:Eu; Eu-activated phosphate phosphors such as Sr$_2$P$_2$O$_7$:Eu; sulfide phosphors such as ZnS:Ag and ZnS:Ag,Al; Ce-activated silicate phosphors such as Y$_2$SiO$_5$:Ce; tungstate phosphors such as CaWO$_4$; Eu- and/or Mn-activated borophosphate phosphors such as (Ba, Sr, Ca)BPO$_5$:Eu,Mn, (Sr, Ca)$_{10}$(PO$_4$)$_6$.nB$_2$O$_3$:Eu, and 2SrO.0.84P$_2$O$_5$.0.16B$_2$O$_3$:Eu; Eu-activated halosilicate phosphors such as Sr$_2$Si$_3$O$_8$.2SrCl$_2$:Eu; Eu-activated oxynitride phosphors such as SrSi$_9$Al$_{19}$ON$_{31}$:Eu and EuSi$_9$Al$_{19}$ON$_{31}$; and 14 Ce-activated oxynitride phosphors such as La$_{1-x}$Ce$_x$Al(Si$_{6-z}$Al$_z$) (N$_{10-z}$O$_z$), where $0 \leq x \leq 1$ and $0 \leq z \leq 6$, and La$_{1-x-y}$Ce$_y$Ce$_x$Ca$_y$Al(Si$_{6-z}$Al$_z$) (N$_{10-z}$O$_z$), where $0 \leq x \leq 1$, $0 \leq y \leq 1$, and $0 \leq z \leq 6$.

Other examples of the blue phosphor include fluorescent dyes such as phthalmide compounds, benzoxazole compounds, styryl compounds, coumarin compounds, pyrazon compounds, and triazole compounds; organic phosphors such as thorium complexes; and the like.

The blue phosphor preferably contains (Ca, Sr, Ba)MgAl$_{10}$O$_{17}$:Eu, (Sr, Ca, Ba, Mg)$_{10}$(PO$_4$)$_6$(Cl, F)$_2$:Eu, or (Ba, Ca, Mg, Sr)$_2$SiO$_4$:Eu; more preferably (Ca, Sr, Ba)MgAl$_{10}$O$_{17}$:Eu, (Sr, Ca, Ba, Mg)$_{10}$(PO$_4$)$_6$(Cl, F)$_2$:Eu, or (Ba, Ca, Sr)$_3$MgSi$_2$O$_8$:Eu; and further more preferably BaMgAl$_{10}$O$_{17}$:Eu, Sr$_{10}$(PO$_4$)$_6$(Cl, F)$_2$:Eu, or Ba$_3$MgSi$_2$O$_8$:Eu. For lighting or display applications, (Sr, Ca, Ba, Mg)$_{10}$(PO$_4$)$_6$Cl$_2$:Eu or (Ca, Sr, Ba)MgAl$_{10}$O$_{17}$:Eu is particularly preferable.

The blue phosphor may be used alone or in combination with another blue phosphor at an arbitrary ratio.

(Yellow Phosphor)

In the case where the yellow phosphor is used as the second phosphor, any type of yellow phosphor can be used as long as advantages of the present invention are not seriously reduced. The emission peak wavelength of the yellow phosphor is usually 530 nm or more, preferably 540 nm or more, and more preferably 550 nm or more. The emission peak wavelength thereof is usually 620 nm or less, preferably 600 nm or less, and more preferably 580 nm or less.

The yellow phosphor usually has an emission peak with a full width at half maximum of 60 to 200 nm. The yellow phosphor usually has an external quantum efficiency of 60% or more and preferably 70% or more.

Examples of the yellow phosphor include oxide phosphors, nitride phosphors, oxynitride phosphors, sulfide phosphors, and oxysulfide phosphors.

Preferable examples of the yellow phosphor include garnet phosphors which are represented by the formula RE$_3$M$_5$O$_{12}$:Ce, where RE represents at least one selected from the group consisting of Y, Tb, Gd, Lu, and Sm and M represents at least one selected from the group consisting of Al, Ga, and Sc, or represented by the formula M$^a_3$M$^b_2$M$^c_3$O$_{12}$:Ce, where M$^a$ represents a bivalent metal element, M$^b$ represents a trivalent metal element, and M$^c$ represents a tetravalent metal element and which have a garnet structure; orthosilicate phosphors represented by the formula AE$_2$M$^d$O$_4$:Eu, where AE represents at least one selected from the group consisting of Ba, Sr, Ca, Mg, and Zn and M$^d$ represents Si and/or Ge; oxynitride phosphors prepared by replacing some of oxygen atoms of these phosphors with nitrogen atoms; and Ce-activated nitride phosphors, such as AEAlSiN$_3$:Ce, where AE represents at least one selected from the group consisting of Ba, Sr, Ca, Mg, and Zn, having a CaAlSiN$_3$: structure.

Other examples of the yellow phosphor include sulfide phosphors such as CaGa$_2$S$_4$:Eu, (Ca, Sr)Ga$_2$S$_4$:Eu, and (Ca, Sr) (Ga, Al)$_2$S$_4$:Eu; Eu-activated oxynitride phosphors, such as Ca$_x$(Si, Al)$_{12}$(O, N)$_{16}$:Eu, having a SiAlON structure; and 3 Eu- and/or Mn-activated haloborate phosphors such as (M$_{1-a-b}$Eu$_a$Mn$_b$)$_2$(BO$_3$)$_{1-p}$(PO$_4$)$_p$X, where M represents at least one selected from the group consisting of Ca, Sr, and Ba, X represents at least one selected from the group consisting of F, Cl, and Br, $0.001 \leq a \leq 0.3$, $0 \leq b \leq 0.3$, and $0 \leq p \leq 0.2$.

Other examples of the yellow phosphor include fluorescent phosphors such as brilliant sulfoflavine FF (Colour Index Number 56205), basic yellow HG (Colour Index Number 46040), eosine (Colour Index Number 45380), and rhodamine 6G (Colour Index Number 45160).

The yellow phosphor may be used alone or in combination with another yellow phosphor at an arbitrary ratio.

(Other Items on Second Phosphor)

The second phosphor may be used alone or in combination with another phosphor at an arbitrary ratio. The ratio of the first phosphor to the second phosphor is arbitrary as long as advantages of the present invention are not seriously reduced. Therefore, the amount of the second phosphor used, a phosphor used in combination with the second phosphor, and the ratio of the second phosphor to the phosphor used in combination therewith may be arbitrarily determined depending on purposes of light-emitting devices.

When the light-emitting device according to the present invention is configured to emit red light, only the first phosphor (red phosphor) may be used and the second phosphor need not be used.

When the light-emitting device according to the present invention is configured to emit white light, the first illuminator may be appropriately used in combination with the first phosphor (red phosphor) and the second phosphor and, for example, Configurations [A] and [B] can be listed.

[A] The first illuminator contains a blue phosphor having an emission peak at a wavelength of 420 to 500 nm and the second illuminator contains the first phosphor, which is the phosphor according to the present invention, and the second phosphor, which is a green or yellow phosphor having an emission peak at a wavelength of greater than 490 to 600 nm.

[B] The first illuminator contains a near-ultraviolet phosphor having an emission peak at a wavelength of 300 to 420 nm and the second illuminator contains the first phosphor, which is the phosphor according to the present invention, and the second phosphor, which is a mixture of a blue phosphor having an emission peak at a wavelength of greater than 420 to 490 nm and a green phosphor having an emission peak at a wavelength of greater than 490 to 600 nm.

When the light-emitting device according to the present invention is configured to emit white light, preferable examples of a combination of the first illuminator, the first phosphor, and the second phosphor include Combinations (a), (b), and (c) below.

(a) A blue illuminator (a blue LED or the like) is used as the first illuminator, a red phosphor (the phosphor according to the present invention or the like) is used as the first phosphor, and a green or yellow phosphor is used as the second phosphor.

In this combination, the green phosphor is preferably one or more selected from the group consisting of a $(Ba, Sr, Ca, Mg)_2SiO_4$:Eu phosphor, a $CaSc_2O_4$:Ce phosphor, a $Ca_3Sc_2Si_3O_{12}$:Ce phosphor, a $SrGa_2S_4$:Eu phosphor, and $M_3Si_6O_{12}N_2$:Eu, where M represents an alkaline-earth metal element.

The yellow phosphor is preferably one or more selected from the group consisting of a $Y_3Al_5O_{12}$:Ce phosphor, a $(Ba, Sr, Ca, Mg)_2SiO_4$:Eu phosphor, and an a-sialon phosphor.

The green phosphor and the yellow phosphor may be used in combination.

(b) A near-ultraviolet illuminator (a near-ultraviolet LED or the like) is used as the first illuminator, a red phosphor (the phosphor according to the present invention or the like) is used as the first phosphor, and a mixture of a blue phosphor and a green phosphor is used as the second phosphor.

In this combination, the blue phosphor is preferably $BaMgAl_{10}O_{17}$:Eu and/or $(Sr, Ca, Ba, Mg)_{10}(PO_4)_6(Cl, F)_2$:Eu.

The green phosphor is preferably one or more selected from the group consisting of $BaMgAl_{10}O_{17}$:Eu,Mn, a $(Ba, Sr, Ca, Mg)_2SiO_4$:Eu phosphor, $(Ba, Sr, Ca)_4Al_{14}O_{25}$:Eu, and $(Ba, Sr, Ca)Al_2O_4$:Eu.

In particular, the near-ultraviolet LED is preferably used in combination with the phosphor according to the present invention, $(Sr, Ca, Ba, Mg)_{10}(PO_4)_6(Cl, F)_2$:Eu, which is the blue phosphor, and $BaMgAl_{10}O_{17}$:Eu,Mn, which is the green phosphor.

(c) A blue illuminator (a blue LED or the like) is used as the first illuminator, a red phosphor (the phosphor according to the present invention or the like) is used as the first phosphor, and an orange phosphor is used as the second phosphor. In this combination, the orange phosphor is preferably $(Sr, Ba)_2SiO_5$:Eu.

The phosphor according to the present invention and another phosphor may be used in the form of a mixture (the term "mixture" used herein means that these phosphors need not be mixed with each other but are used in combination). A preferable phosphor mixture can be obtained by mixing these phosphors. The type of the phosphor mixed with the phosphor according to the present invention and the mixing ratio of these phosphors are not particularly limited.

[4-3. Sealing Material]

The phosphors used in the light-emitting device according to the present invention are used in such a state that the phosphors are dispersed in the liquid medium, which is a sealing material.

The liquid medium is as described in the term "3-2. Liquid medium".

In order to control the refractive index of the sealing material, the liquid medium may contain a metal element that can be converted into a metal oxide with a high refractive index. Examples of the metal element, which can be converted into such a metal oxide with a high refractive index, include Si, Al, Zr, Ti, Y, Nb, and B. These metal elements may be used alone or in combination at an arbitrary ratio.

The form of the magnetic layer is not particularly limited as long as the transparency of the sealing material is not reduced. The metal element may be present in the form of a uniform glass layer having a metaloxane bond or present in the sealing material in the form of particles. When the metal element is present in the form of particles, inner portions of the particles may be amorphous or crystalline and are preferably crystalline because of the achievement of a high refractive index. In order not to reduce the transparency of the sealing material, the size of the particles is usually less than or equal to the wavelength of the light emitted from semiconductor light-emitting devices, preferably 100 nm or less, more preferably 50 nm or less, and particularly preferably 30 nm or less. The metal element may be present in the sealing material in the form of particles in such a manner that a silicone material is mixed with particles of silicon dioxide, aluminum oxide, zirconium oxide, titanium oxide, yttrium oxide, or niobium oxide.

The liquid medium may further contain a known additive such as a diffusing agent, a filler, a viscosity modifier, or an ultraviolet absorber.

[4-4. Components of Light-emitting Device (Others)]

Components of the light-emitting device according to the present invention are not particularly limited except the excitation light source (first illuminator) and phosphor (second illuminator) described above. The excitation light source (first illuminator) and the phosphor (second illuminator) are usually arranged on an appropriate frame. When being excited with the light emitted from the excitation light source (first illuminator), the phosphor (second illuminator) emits light. The excitation light source (first illuminator) and the phosphor (second illuminator) are arranged such that the light emitted from the excitation light source (first illuminator) and/or the light emitted from the phosphor is taken outside. In the case where a plurality of phosphors are used, the phosphors need not present in a single layer in a mixed state. The phosphors may be separately contained in different layers depending on the color of the light emitted from each phosphor. For example, a layer containing the first phosphor may be disposed on a layer containing the second phosphor.

The light-emitting device according to the present invention may further include a member in addition to the excitation light source (first illuminator), the phosphor (second illuminator), and the frame. An example of such a member is the sealing material. In the light-emitting device, the sealing material may be used to disperse the phosphor (second illuminator) and also may be used to bond the excitation light source (first illuminator) and the phosphor (second illuminator) to the frame.

[4-5. Embodiments of Light-emitting Device]

The light-emitting device according to the present invention will now be described in detail with reference to embodiments. The present invention is not limited to the embodiments and any modifications may be made within the scope of the present invention.

FIG. 1 is a schematic perspective view showing the relationship between a first illuminator functioning as an excitation light source and a second illuminator configured as a phosphor-containing portion containing a phosphor, the first illuminator and the second illuminator being included in an example of the light-emitting device according to the present invention. With reference to FIG. 1, reference numeral 1 represents the phosphor-containing portion (second illuminator), reference numeral 2 represents a surface-emitting GaN-based LD functioning as the excitation light source (first illuminator), and reference numeral 3 represents a substrate. In the manufacture of the light-emitting device shown in FIG. 1, the LD (2) and the phosphor-containing portion (second illuminator) (1) may be separately prepared and surfaces thereof may be then bonded to each other with an adhesive or the like. Alternatively, the phosphor-containing portion (second illuminator) may be provided (formed) on a light-emitting surface of the LD (2). This allows the LD (2) and the phosphor-containing portion (second illuminator) (1) to be in contact with each other.

When the light-emitting device has such a configuration, a reduction in the amount of light can be avoided, that is, it can be avoided that the light emitted from the excitation light source (first illuminator) is reflected by a surface of the phosphor-containing portion (second illuminator) and leaks outside. This is effective in enhancing the light emission efficiency of the light-emitting device.

Figure 2A:
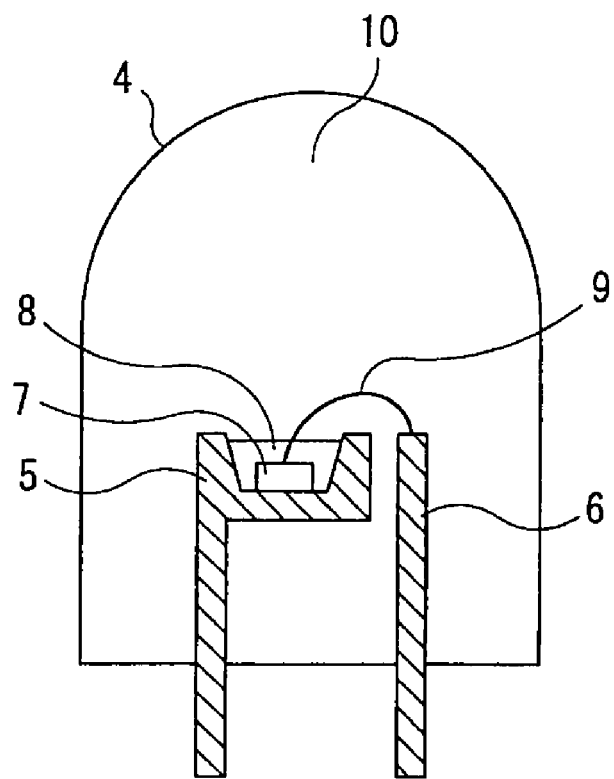
FIGS. 2(a) and 2(b) are schematic sectional views each showing an example of a light-emitting device including an excitation light source (first illuminator) and a phosphor-containing portion (second illuminator).

FIG. 2(a) is a schematic sectional view of an example of a light-emitting device which is a typical example of a light-emitting device referred to as a cannonball type and which includes an excitation light source (first illuminator) and a phosphor-containing portion (second illuminator). In the light-emitting device (4), reference numeral 5 represents a mount lead, reference numeral 6 represents an inner lead, reference numeral 7 represents the excitation light source (first illuminator), reference numeral 8 represents the phosphor-containing portion (second illuminator), reference numeral 9 represents a conductive wire, and reference numeral 10 represents a molding member.

Figure 2B:
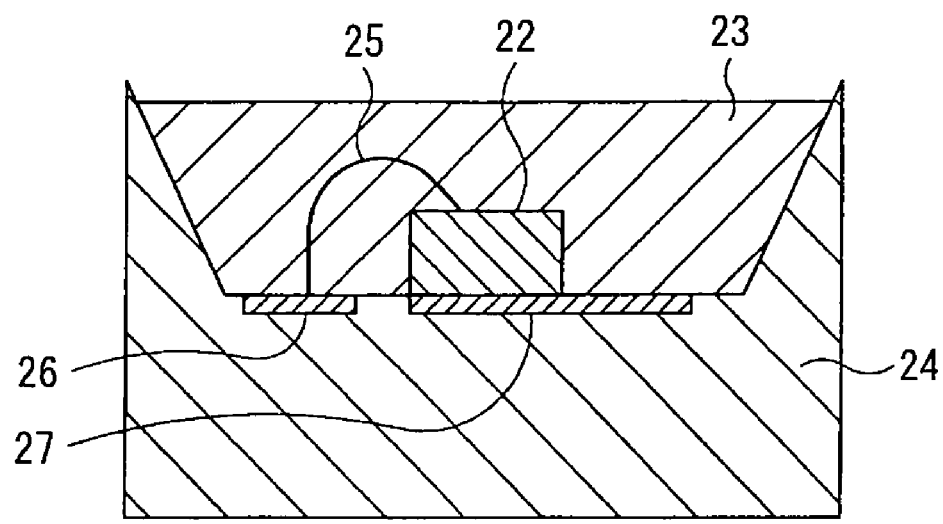

FIG. 2(b) is a schematic sectional view of an example of a light-emitting device which is a typical example of a light-emitting device referred to as a surface-mounting type and which includes an excitation light source (first illuminator) and a phosphor-containing portion (second illuminator). With reference to this figure, reference numeral 22 represents the excitation light source (first illuminator), reference numeral 23 represents the phosphor-containing portion (second illuminator), reference numeral 24 represents a frame, reference numeral 25 represents a conductive wire, and reference numerals 26 and 27 each represents an electrode.

[4-6. Other Items on Light-Emitting Device]

When the above light-emitting devices according to the present invention each include the excitation light source (first illuminator); uses the phosphor according to the present invention in combination with some of known phosphors such as the red phosphor, the green phosphor, the blue phosphor, and the yellow phosphor; and has a known configuration, the light-emitting devices can function as white light-emitting devices.

A combination of an excitation light source emitting blue light, the green phosphor, and the orange or red phosphor is useful in manufacturing a white light-emitting device. The color of the light emitted from the white light-emitting device can be desirably controlled by varying the wavelength of the light emitted from the phosphor according to the present invention or another phosphor used in combination therewith. For example, an emission spectrum similar to that of pseudo-white light (for example, the light emitted from a light-emitting device including a blue LED and the yellow phosphor) can be obtained from the white light-emitting device. A combination of the white light-emitting device and the red phosphor is effective in manufacturing a light-emitting apparatus with a high red color rendering index or a light-emitting apparatus emitting light of a color similar to the color (warm white) of a light bulb. A combination of an excitation light source emitting near-ultraviolet light, the blue phosphor, the green phosphor, and the red phosphor is effective in manufacturing the white light-emitting device. The color of the light emitted from the white light-emitting device covers yellowish white, greenish white, bluish white, violet white, and white as specified in JIS Z 8701 and is preferably white.

The emission spectrum of the light-emitting device can be measured with a color-illuminance measurement software and USB 2000-series spectrometer (equipped with an integrating sphere) available from Ocean Optics Inc. in such a manner that the light-emitting device is placed in a chamber maintained at a temperature of 25° C.±1° C. and is supplied with a current of 20 mA. From the data of the 380-780 nm wavelength range of the emission spectrum, chromaticity values (x, y, and z) can be calculated using color coordinates in the XYZ color system specified in JIS Z 8701. The equation x+y+z=1 holds herein. The XYZ color system is herein referred to as an XY color system in some cases and the XY color system is usually expressed in (x, y).

The average color rendering index (Ra) and specific color rendering index R9 of the light-emitting device according to the present invention are usually 80 or more, preferably 90 or more, and more preferably 95 or more.

[5. Applications of Light-Emitting Device]

Applications of the light-emitting device according to the present invention are not particularly limited. The light-emitting device can be used in various fields where ordinary light-emitting devices are used. The light-emitting device has a wide color reproduction range and a high color rendering index and is suitable for light sources for lighting systems and displays.

[5-1. Lighting System]

In the case where the light-emitting device according to the present invention is applied to lighting systems, the light-emitting device may be incorporated into a known lighting system. An example of such a known lighting system is a surface-emitting lighting system (11) including the light-emitting device (4) shown in FIG. 3.

Figure 3:
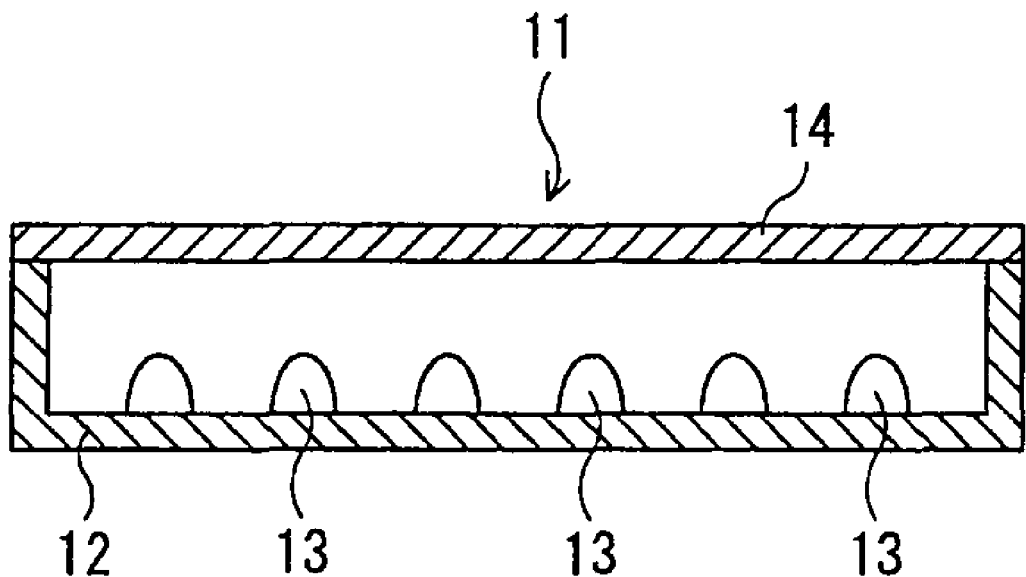
FIG. 3 is a schematic sectional view of an example of a lighting system according to the present invention.

FIG. 3 is a schematic sectional view of an example of a lighting system according to the present invention. With reference to FIG. 3, the surface-emitting lighting system includes a rectangular support casing (12) with opaque inner surfaces such as white flat inner surfaces; a large number of light-emitting devices (13) (which correspond to the light-emitting device (4)) arranged on the bottom surface of the support casing; a power supply and circuit (not shown), arranged outside the support casing, for driving the light-emitting devices (13); and a milky-white diffusing plate (14), such as a acrylic plate, for emitting uniform light, the diffusing plate (14) being fixed at a position corresponding to a lid of the support casing (12).

The operation of the surface-emitting lighting system (11) allows voltages to be applied to excitation light sources (first illuminators) included in the light-emitting devices (13), whereby light is emitted from the excitation light sources. The phosphor contained in phosphor-containing portions (second illuminators) absorbs a portion of the light emitted therefrom to emit visible light, which is then mixed with the blue light reflected by the phosphor, whereby light with a high color rendering index is created. This light is emitted through the diffusing plate (14) in the upward direction of this figure, whereby uniform, bright light is created in the plane of the diffusing plate (14) of the support casing (12).

[5-2. Display]

In the case where the light-emitting device according to the present invention is used as a light source for use in a display, although components of the display are not particularly limited, the light-emitting device is preferably used in combination with a color filter. When the display is a color display including color liquid-crystal display devices, the following members can be used in combination to form the display: a backlight including the light-emitting device according to the present invention, liquid-crystal light shutters, and color filters including red, green, and blue pixels.

The color reproduction range of the light emitted through the color filters is usually 60% or more, preferably 70% or more, and more preferably 72% or more and is usually 150% or less as expressed in an NTSC ratio.

The ratio of the light emitted through each color filter to the light applied to the color filter is usually 20% or more, preferably 25% or more, more preferably 28% or more, and further more preferably 30% or more (light utilization efficiency). The light utilization efficiency is preferably high and is usually 33% or less because three types of color filters, that is, red, green, and blue filters are used.

EXAMPLES

The present invention will now be described in detail with reference to examples. The present invention is not limited to the examples and modifications may be made within the scope of the present invention.

[1. Techniques for Measuring or Evaluating Phosphor]

In examples and comparative examples below, phosphor particles were evaluated by techniques below.

[Technique for Measuring Emission Spectrum]

An emission spectrum was measured with the spectrometer FP-6500 available from Japan Spectroscopy Co., Ltd.

The wavelength and full width at half maximum of an emission peak were determined from the obtained spectrum. The intensity of light was expressed with a relative value determined by assigning a score of 100 to the peak intensity of the light emitted from the product BR-101A (Lot No. STD0001), available from Mitsubishi Chemical Corporation, excited with 455-nm wavelength light. The peak intensity of emitted light is preferably high.

[Technique for Determining Color Coordinates]

Color coordinates CIEx and CIEy in the XYZ color system specified in JIS Z 8701 were calculated from the data of the 380-780 nm wavelength range (in the case of excitation light with a wavelength of 455 nm) of an emission spectrum by a technique according to JIS Z 8724.

[Internal Quantum Efficiency, External Quantum Efficiency, and Absorption Efficiency]

The absorption efficiency $\alpha q$, internal quantum efficiency $\eta i$, and external quantum efficiency $\eta i$ of each phosphor were determined as described below.

In order to assure the accuracy of measurement, a sample of the phosphor for measurement was packed into a cell such that the surface of the phosphor sample was smooth. The cell was attached to an integrating sphere.

The light emitted from a light source (150-W Xe lamp) for exciting the phosphor was guided into the integrating sphere through an optical fiber. The light emitted from the light source was filtered through a monochromator (grating spectroscope) or the like such that monochromatic light with a wavelength of 455 nm was generated. In order to excite the phosphor, the monochromatic light generated as described above was applied to the phosphor sample for measurement. The spectrum of the light emitted from the phosphor sample and that of the light reflected thereby were measured with a spectrometer (MCPD 7000, available from Otsuka Electronics Co., Ltd.). The light traveling in the integrating sphere was guided into the spectrometer.

The absorption efficiency $\alpha q$ of the phosphor is a value determined by dividing the number $N_{abs}$ of photons of excitation light that were absorbed by the phosphor sample by the number N of all photons of excitation light.

The number N of all photons of excitation light is proportional to a value determined by Function (4) below. The following plate was attached to the integrating sphere in the same manner as that used to attach the phosphor sample thereto, a reflective plate which had a reflectivity available from Labsphere. The reflection spectrum $I_{ref}(\lambda)$ of the reflective plate was measured with the spectrometer by irradiating the reflective plate with excitation light and then the value of Function (4) was then determined.

(Function 4)

$$\frac{1}{R}\int \lambda \cdot I_{ref}(\lambda)d\lambda \quad [M4]$$

The integration interval was 410 to 480 nm.

The number $N_{abs}$ of photons of excitation light that were absorbed by the phosphor sample is proportional to a value determined by Function (5) below.

(Function 5)

$$\frac{1}{R}\int \lambda \cdot I_{ref}(\lambda)d\lambda - \int \lambda \cdot I(\lambda)d\lambda \quad [M5]$$

The reflection spectrum $I(\lambda)$ of the phosphor sample determined for absorption efficiency $\alpha q$ was measured. The integration interval of Function (5) was the same as that of Function (4). Since the measurements of an actual spectrum are usually obtained in the form of digital data separated for each limited band relating to $\lambda$, the integrals of Functions (4) and (5) were determined by a finite sum based on the band.

The equation $\alpha q = N_{abs}/N =$ Function (5)/Function (4) was then calculated.

The internal quantum efficiency $\eta i$ was determined as described below. The internal quantum efficiency $\eta i$ is a value determined by dividing the number $N_{PL}$ of photons originating from fluorescence by the number $N_{abs}$ of photons absorbed by the phosphor sample.

The number $N_{PL}$ is proportional to a value determined by Function (6) below.

[M6]

$$\int \lambda \cdot I(\lambda)d\lambda \quad \text{(Function 6)}$$

The integration interval was 481 to 800 nm.

The equation $\eta i =$ Function (6)/Function (5) was then calculated, whereby the internal quantum efficiency $\eta i$ was determined.

Function (6) was integrated from a spectrum obtained in determined.

Function (6) was integrated from a spectrum obtained in the form of digital data in the same manner as that used to determine the absorption efficiency $\alpha q$.

The external quantum efficiency $\eta o$ was determined by multiplying the absorption efficiency $\alpha q$ and the internal quantum efficiency $\eta i$ together.

[Weight-average Median Diameter]

The weight-average median diameter was measured with the laser diffraction-scattering particle size distribution analyzer Model 1064 available from CILAS. A dispersion medium used was water.

[X-Ray Powder Diffraction]

The X-ray powder diffraction was precisely measured with the X-ray powder diffractometer X'Pert available from PANalytical. Measurement conditions were as described below.

CuKα tube

X-ray power: 45 kV, 40 mA

Divergence slit: ¼ degree, X-ray mirror

Detector: Semiconductor array detector X' celerator equipped with Ni filter

Scanning range 2θ: 10 to 65 degrees

Read width: 0.05 degree

Count time: 33 seconds

Comparative Example 1

$Ca_3N_2$, AlN, $Si_3N_4$, and $EuF_3$ were weighed such that composition ratios (the amount of $Si_3N_4$ was such that the number of moles of Si was 1.14 times that of Al) shown in Table 1 were obtained. That is, the following compounds were used: 68.61 g of $Ca_3N_2$ (available from CERAC incorporate), 57.37 g of AlN (available from Tokuyama Corporation), 74.61 g of $Si_3N_4$ (available from Ube Industries, Ltd.), and 2.34 g of $EuF_3$ (available from Shin-Etsu Chemical Co., Ltd.).

Powders of these raw materials were uniformly mixed together with a mixer placed in an $N_2$ glove box in which the oxygen concentration and moisture concentration were maintained 20 ppm and 5 ppm, respectively. The mixture obtained as described above was packed into a BN crucible and then press-molded by applying a small load to the mixture. The crucible was placed into a resistance heating-type vacuum-pressurized atmosphere heat-treating furnace (available from Fujidempa Kogyo Co., Ltd.) and then heated from room temperature to 800° C. at a rate of 10° C./min in a vacuum <$5\times10^{-3}$ Pa (that is, less than $5\times10^{-3}$ Pa). After the temperature of the mixture reached 800° C., the mixture was maintained at this temperature and a high-purity nitrogen gas (99.9995%) was introduced into the furnace for 30 minutes such that the pressure therein was increased to 0.5 MPa. After the introduction of the nitrogen gas, the mixture was heated to 1800° C. at a rate of 5° C./min while the pressure therein was maintained at 0.5 MPa. After the mixture was maintained at this temperature for three hours, the mixture was cooled to room temperature.

The fired product obtained was coarsely pulverized in a mortar. The coarse powder was sieved through a 224-mesh screen. After the particles sieved through the screen were wet-pulverized in a ball mill using water, the wet-pulverized particles were pickled in such a manner that the wet-pulverized particles were stirred in 2N hydrochloric acid for one hour. After the conductivity of the supernatant liquid reached 8 mS/m, the resulting particles were dried and then sieved through a 37-mesh screen, whereby an inorganic compound was obtained. The obtained inorganic compound was analyzed by powder X-ray diffractometry, whereby the presence of a $CaAlSiN_3$:Eu phosphor was confirmed. The X-ray diffraction pattern thereof was shown in FIG. 4. The obtained inorganic compound was evaluated for fluorescent properties, weight-average median diameter, and quantum efficiency. The evaluation results were summarized in Table 1.

Example 1

An inorganic compound was produced in substantially the same manner as that described in Comparative Example 1 except that the amount of $Si_3N_4$ used was varied such that the number of moles of Si was 1.03 times that of Al. The inorganic compound was evaluated for fluorescent properties, weight-average median diameter, and quantum efficiency. The evaluation results were summarized in Table 1. The X-ray diffraction pattern thereof was shown in FIG. 4.

Examples 2 to 4

Inorganic compounds were produced in substantially the same manner as that described in Example 1 except that the number of moles of Eu was varied as shown in Table 1. The inorganic compounds were evaluated for fluorescent properties, weight-average median diameter, and quantum efficiency. The evaluation results were summarized in Table 1. The X-ray diffraction patterns thereof were shown in FIG. 4.

TABLE 1

| | Molar composition of feedstocks | | | | Emission properties | | | | Weight-average median diameter $D_{50}$ (μm) | Quantum efficiency | | |
|---|---|---|---|---|---|---|---|---|---|---|---|---|
| | $EuF_3$ (as Eu) | $Ca_3N_2$ (as Ca) | AlN (as Al) | $Si_3N_4$ (as Al) | Emission peak wavelength (nm) | Emission intensity | CIEx | CIEy | | Internal | Absorption | External |
| Comparative Example 1 | 0.008 | 0.992 | 1.00 | 1.14 | 649 | 105 | 0.655 | 0.345 | 11 | 0.91 | 0.84 | 0.76 |
| Example 1 | 0.008 | 0.992 | 1.00 | 1.03 | 653 | 115 | 0.671 | 0.330 | 11 | 0.86 | 0.86 | 0.74 |
| Example 2 | 0.010 | 0.990 | 1.00 | 1.03 | 655 | 116 | 0.675 | 0.325 | 10 | 0.85 | 0.88 | 0.75 |
| Example 3 | 0.012 | 0.988 | 1.00 | 1.03 | 657 | 111 | 0.678 | 0.322 | 10 | 0.90 | 0.88 | 0.79 |
| Example 4 | 0.015 | 0.985 | 1.00 | 1.03 | 659 | 112 | 0.682 | 0.318 | 10 | 0.84 | 0.91 | 0.76 |

Examples 5, 6, 10, and 11 and Comparative Examples 2 and 3

Fired products were obtained in substantially the same manner as that described in Example 1 except that that the amounts of raw materials were varied such that raw material compositions shown in Table 2 were achieved. The fired products obtained were each coarsely pulverized in a mortar. The coarse powders obtained were each sieved through a 224-mesh screen. The particles sieved through the screen were further pulverized in a mortar. The powders obtained were each sieved through a 37-mesh screen, whereby inorganic compounds were obtained. The inorganic compounds were evaluated for fluorescent properties and quantum efficiency. The evaluation results were summarized in Table 2.

TABLE 2

| | Molar composition of feedstocks | | | | Emission properties | | | | | | |
|---|---|---|---|---|---|---|---|---|---|---|---|
| | $EuF_3$ (as Eu) | $Ca_3N_2$ (as Ca) | AlN (as Al) | $Si_3N_4$ (as Al) | Emission peak wavelength (nm) | Emission intensity | CIEx | CIEy | Quantum efficiency | | |
| | | | | | | | | | Internal | Absorption | External |
| Comparative Example 2 | 0.020 | 0.980 | 1.00 | 0.87 | 664 | 96 | 0.694 | 0.307 | 0.65 | 0.94 | 0.61 |
| Comparative Example 3 | 0.020 | 0.980 | 1.00 | 0.92 | 664 | 104 | 0.694 | 0.307 | 0.79 | 0.88 | 0.70 |
| Example 5 | 0.020 | 0.980 | 1.00 | 1.03 | 662 | 115 | 0.690 | 0.312 | 0.78 | 0.93 | 0.73 |
| Example 6 | 0.025 | 0.975 | 1.00 | 1.03 | 664 | 112 | 0.694 | 0.308 | 0.80 | 0.92 | 0.74 |
| Example 10 | 0.020 | 0.980 | 1.00 | 1.06 | 662 | 121 | 0.687 | 0.314 | 0.88 | 0.90 | 0.79 |
| Example 11 | 0.020 | 0.980 | 1.00 | 1.11 | 661 | 120 | 0.684 | 0.317 | 0.88 | 0.89 | 0.78 |

The results of Example 5 and Comparative Examples 2 and 3 show that an increase in the amount of $Si_3N_4$ per Al increases emission intensity. The results of Example 1 and Comparative Example 1 show that emission spectrum decreases when the number of moles of Si is 1.14 times that of Al.

As is clear from the above results, the phosphors produced by a method according to the present invention are prevented from being reduced in emission intensity although the emission peak wavelengths thereof are shifted to longer wavelengths.

Example 7

An inorganic compound was produced in substantially the same manner as that described in Example 5 except that europium oxide was used as a source of Eu. The inorganic compound was evaluated for fluorescent properties and quantum efficiency. The evaluation results were summarized in Table 3.

Comparative Example 4

An inorganic compound was produced in substantially the same manner as that described in Example 7 except that the amount of $Si_3N_4$ used was varied such that the number of moles of Si was 0.92 times that of Al. The inorganic compound was evaluated for fluorescent properties and quantum efficiency. The evaluation results were summarized in Table 3.

Example 8

The following materials were used: 71.90 g of $Ca_3N_2$, 61.48 g of AlN, 72.25 g of $Si_3N_4$, and 9.40 g of $EuF_3$. The ratio of $Ca_3N_2$ to AlN to $Si_3N_4$ to $EuF_3$ was 0.97:1.00:1.03:0.03.

Powders of these materials were uniformly mixed together with a mixer placed in an $N_2$ glove box. The mixture obtained as described above was packed into a BN crucible and then press-molded by applying a small load to the mixture.

The crucible was placed into a resistance heating-type vacuum-pressurized atmosphere heat-treating furnace (available from Fujidempa Kogyo Co., Ltd.) and then heated from room temperature to 800° C. at a rate of 10° C./min in a vacuum $<5\times10^{-3}$ Pa (that is, less than $5\times10^{-3}$ Pa). After the temperature of the mixture reached 800° C., the mixture was maintained at this temperature and a high-purity nitrogen gas (99.9995%) was introduced into the furnace for 30 minutes such that the pressure therein was increased to 0.5 MPa. After the introduction of the nitrogen gas, the mixture was heated to 1800° C. at a rate of 5° C./min while the pressure therein was maintained at 0.5 MPa. After the mixture was maintained at this temperature for three hours, the mixture was cooled to room temperature.

The fired product obtained was subjected to pulverization, pickling, and then sieving in substantially the same manner as that described in Example 1, whereby an inorganic compound was obtained. The inorganic compound was evaluated for fluorescent properties and weight-average median diameter. This showed that a phosphor had an emission peak wavelength of 666 nm, an emission intensity of 109, an internal

TABLE 3

| | Molar composition of feedstocks | | | | Emission properties | | | | | | |
|---|---|---|---|---|---|---|---|---|---|---|---|
| | $Eu_2O_3$ (as Eu) | $Ca_3N_2$ (as Ca) | AlN (as Al) | $Si_3N_4$ (as Al) | Emission peak wavelength (nm) | Emission intensity | CIEx | CIEy | Quantum efficiency | | |
| | | | | | | | | | Internal | Absorption | External |
| Example 7 | 0.020 | 0.980 | 1.00 | 1.03 | 661 | 108 | 0.691 | 0.311 | 0.71 | 0.95 | 0.67 |
| Comparative Example 4 | 0.020 | 0.980 | 1.00 | 0.92 | 663 | 88 | 0.693 | 0.307 | 0.70 | 0.91 | 0.64 |

Figure 5:
FIG. 5 is a SEM image of phosphor particles obtained as described in Example 8.

The above results, which were obtained from the use of europium oxide as a source of Eu, show substantially the same tendency as that of the results of Example 5 and Comparative Examples 2 and 3.

quantum efficiency of 0.77, an absorption quantum efficiency of 0.95, an external quantum efficiency of 0.72, (CIEx, CIEy)=(0.692, 0.308), and a weight-average median diameter $D_{50}$ of 11 μm. A SEM image of crystal grains of the phosphor was shown in FIG. 5. The observation of 50 or more of the phosphor crystal grains by SEM showed that the phosphor contained crystal grains having a characteristic shape, that is, an aspect ratio of three or more.

Reference Example 1

Production of (Ba, Sr)$_2$SiO$_4$:Eu

Powders of raw materials for producing a phosphor were weighed such that the phosphor had the composition formula Ba$_{1.39}$Sr$_{0.46}$Eu$_{0.15}$SiO$_4$, that is, the amount of BaCO$_3$, that of SrCO$_3$, that of Eu$_2$O$_3$, and that of SiO$_2$ were 1.39, 0.46, 0.15, and 1 moles, respectively, per mole of the phosphor. The powders were dry-mixed together in a plastic bag, sieved through a 100-micron nylon mesh, and then further dry-mixed together in a plastic bag.

The raw material mixture obtained was loosely packed into an alumina crucible. A hole was formed in the mixture. An alumina lid was placed onto the crucible such that a gap was present therebetween. The crucible, which contained the raw material mixture, fired at a temperature of up to 1000° C. for 12 hours in a reducing furnace with a nitrogen atmosphere. The fired powder was ground in an alumina mortar, sieved through a 100-µm nylon mesh, and then blended with SrCl$_2$.H$_2$O used as a flux such that the amount of SrCl$_2$.H$_2$O was 12% by weight of the raw material mixture. The blend was sieved through a 65-µm nylon mesh. The resulting blend was loosely packed into an aluminum crucible and then fired in the presence of solid carbon at a temperature of up to 1190° C. for five hours in a CO-containing atmosphere. The fired powder was ground in a stamp mill and then sieved through a 37-µm nylon mesh. A slurry was prepared by dispersing the fired powder in a fivefold volume of pure water and then concentrated by decantation. The resulting slurry was water-sieved through a 37-µm nylon mesh without applying force to the slurry. A liquid containing undersize particles was diluted to a predetermined volume. Fine particles were removed from the supernatant liquid of the diluted liquid. The remaining particles were repeatedly washed with water such that the conductivity of a supernatant liquid was reduced to 2 mS/m or less. The resulting particles were dehydrated using a nutsche, dried at 150° C. for ten hours in a dryer, and then finally sieved through a 37-µm nylon mesh, whereby Ba$_{1.39}$Sr$_{0.46}$Eu$_{0.15}$SiO$_4$ was obtained.

Example 11 and Comparative Example 5

Each surface mounting-type white light-emitting device with dimensions of 3.5×2.8 mm was prepared by a procedure below as shown in FIG. 2(b) and then evaluated for chromaticity using CIE color coordinates (CIEx, CIEy).

A blue light-emitting diode (hereinafter referred to as "blue LED") used was the product C460EZ290 available from Cree Inc. The blue LED (22) was die-bonded to an electrode (27) disposed at the bottom of a recessed portion of a frame (24) using a silver paste. In consideration of the heat generated from the blue LED (22), the silver paste was uniformly spread on the electrode. After the silver paste was heated at 150° C. for two hours so as to be cured, the blue LED (22) was wire-bonded to the electrode (26) of the frame (24). A wire (25) used was a gold wire with a diameter of 25 µm.

Luminescent materials contained in a phosphor-containing portion (23) were a green phosphor produced in the same manner as that described in Reference Example 1 and a red phosphor produced in the same manner as that described in Example 5 or Comparative Example 1. These phosphors were taken at a ratio shown in Table 4 and then mixed with a silicone resin (SCR-1011, available from Shin-Etsu Chemical Co., Ltd.), whereby a phosphor slurry (phosphor-containing composition) was prepared.

The phosphor slurry was poured into the recessed portion of the frame (24) and then heated at 150° C. for three hours so as to be cured, whereby the phosphor-containing portion (23) was formed. This resulted in the completion of the surface mounting-type white light-emitting device.

Figure 6:
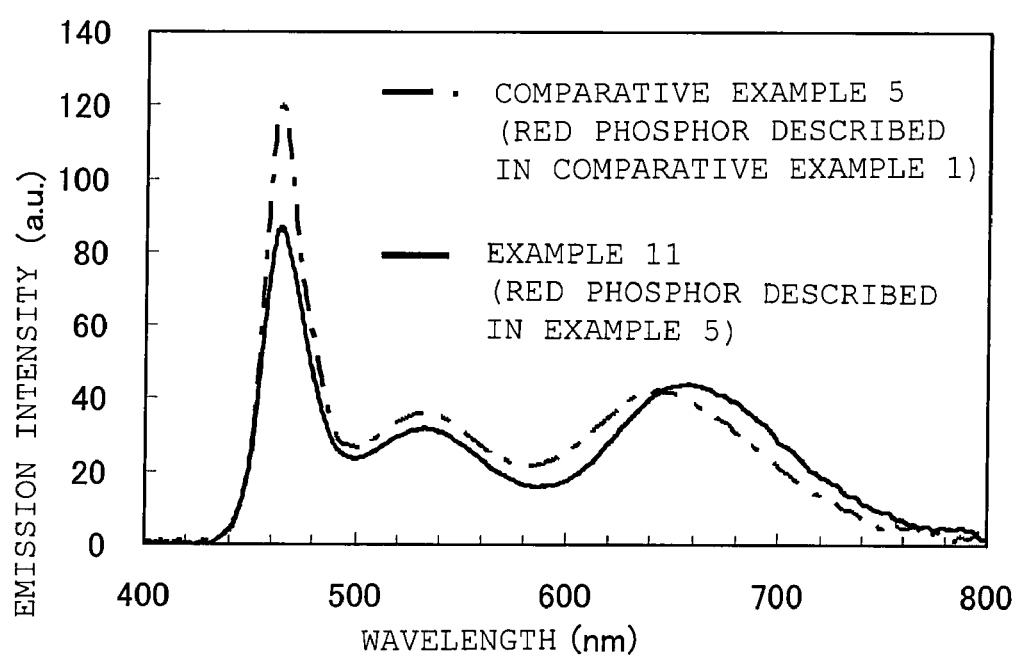
FIG. 6 is a graph showing the emission spectra of white light-emitting devices prepared as described in Example 11 and Comparative Example 5.

The light-emitting device was operated with a current of 20 mA at 25° C. to emit light. The whole light emitted from the white light-emitting device was received with an integrating sphere, guided to a spectrometer through an optical fiber, and then measured for emission spectrum and total luminous flux, whereby color coordinates were determined. In particular, measurement was performed in a chamber maintained at a temperature of 25° C.±1° C. using a color-illuminance measurement software and USB 2000-series spectrometer (equipped with an integrating sphere) available from Ocean Optics Inc. The emission spectrum obtained was shown in FIG. 6.

From the data of the 380-780 nm wavelength range of the emission spectrum and the spectrum data of color filters, chromaticity values of red, green, or blue light emitted through one of the color filters were determined using color coordinates in the XYZ color system specified in JIS Z 8701. The NTSC ratio of the white light-emitting device and chromaticity values (CIEx, CIEy) of white light were calculate. The calculation results were summarized in Table 4.

TABLE 4

| | Phosphor | | Ratio of phosphor to silicone resin (% by weight) | | | |
|---|---|---|---|---|---|---|
| | Green phosphor | Red phosphor | Green phosphor | Red phosphor | NTSC ratio | CIEx | CIEy |
| Example 11 | (Ba,Sr)$_2$SiO$_4$:Eu | Example 5 | 16 | 1 | 73 | 0.32 | 0.32 |
| Comparative Example 5 | (Ba,Sr)$_2$SiO$_4$:Eu | Comparative Example 1 | 15 | 3 | 70 | 0.32 | 0.32 |

The above results show that the use of an inorganic compound according to the present invention as a red phosphor leads to an increase in the NTSC ratio of the white light-emitting device.

The present invention is effective in producing a red phosphor with a specific composition and is particularly suitable for applications, such as lighting systems and displays, for the red phosphor.

The present invention is as described above with reference to the examples and it is evident to those skilled in the art that various modifications may be made within the scope of the present invention.

The present application is based on Japanese Patent Application (Japanese Patent Application No. 2007-108924) filed on Apr. 18, 2007, the disclosure of which is incorporated herein by reference.

The invention claimed is:

1. A method, comprising firing a feedstock prepared by mixing compounds serving as sources of Al, Si, the element represented by M1, and the element represented by M2, wherein the amount of Si in the feedstock is greater than one mole and less than 1.14 moles per mole of Al, to obtain an inorganic compound represented by formula (I):

$$M1_aM2_bAlSiX_3 \qquad (I)$$

where
M1 represents an activation element comprising at least Eu,
M2 represents at least one or more alkaline-earth metal element,
X represents one or more selected from the group consisting of O and N, and
a and b each represent a positive number where $0 < a \leq 0.1$ and $0.8 \leq a + b \leq 1$,
wherein a source of the element represented by M1 is a halide.

2. The method according to claim 1, wherein $0.01 \leq a \leq 0.05$.

3. A phosphor comprising
crystal grains with an aspect ratio of three or more; and
a crystalline phase of an inorganic compound represented by formula (I):

$$M1_aM2_bAlSiX_3 \qquad (I)$$

where
M1 represents an activation element comprising at least Eu,
M2 represents one or more alkaline-earth metal elements,
X represents one or more selected from the group consisting of O and N, and
a and b each represent a positive number where $0 < a \leq 0.1$ and $0.8 \leq a + b \leq 1$,
the phosphor having an emission peak wavelength of 650 nm or more and an internal quantum efficiency of 0.75 or more when being excited with 455-nm wavelength light.

4. The phosphor according to claim 3, further having an emission peak intensity of 106 or more when excited with 455-nm wavelength light, the emission peak intensity of the phosphor calculated by assuming the product BR-101A, available from Mitsubishi Chemical Corporation, excited with 455-nm wavelength light to be 100.

5. The phosphor according to claim 3, wherein the emission peak wavelength and internal quantum efficiency of the phosphor excited with 455-nm wavelength light are 655 nm or more and 0.85 or more, respectively.

6. A phosphor comprising composition comprising the phosphor according to claim 3 and a liquid medium.

7. A light-emitting device comprising a first illuminator and a second illuminator that emits visible light when the second illuminator is irradiated with the light emitted from the first illuminator,
wherein the second illuminator contains at least one phosphor according to claim 3 as a first phosphor.

8. The light-emitting device according to claim 7, wherein the second illuminator contains at least one phosphor having an emission peak wavelength different from that of the first phosphor as a second phosphor.

9. The light-emitting device according to claim 8, wherein the first illuminator has an emission peak at a wavelength of 420 to 500 nm and the second illuminator contains at least one phosphor having an emission peak at a wavelength of greater than 490 to 600 nm as the second phosphor.

10. The light-emitting device according to claim 8, wherein the first illuminator has an emission peak at a wavelength of 300 to 420 nm and the second illuminator contains at least one phosphor having an emission peak at a wavelength of greater than 420 to 490 nm and at least one phosphor having an emission peak at a wavelength of greater than 490 to 600 nm as the second phosphor.

11. A lighting system comprising the light-emitting device according to claim 7.

12. A display comprising the light-emitting device according to claim 7.

13. The method according to claim 1, wherein M2 is at least one element selected from the group consisting of Mg, Ca, Sr, and Ba.

14. The phosphor according to claim 3, wherein M2 is at least one element selected from the group consisting of Mg, Ca, Sr, and Ba.

* * * * *